United States Patent
Novotny et al.

(10) Patent No.: US 10,551,728 B1
(45) Date of Patent: Feb. 4, 2020

(54) STRUCTURED PHOSPHORS FOR DYNAMIC LIGHTING

(71) Applicant: Soraa Laser Diode, Inc., Goleta, CA (US)

(72) Inventors: Vlad Joseph Novotny, Los Gatos, CA (US); Troy Trottier, Cary, NC (US); James W. Raring, Santa Barbara, CA (US); Paul Rudy, Manhattan Beach, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 8 days.

(21) Appl. No.: 15/949,608

(22) Filed: Apr. 10, 2018

(51) Int. Cl.
*G03B 21/20* (2006.01)
*G02B 1/11* (2015.01)
(Continued)

(52) U.S. Cl.
CPC .............. *G03B 21/204* (2013.01); *G02B 1/11* (2013.01); *G03B 21/005* (2013.01); *H01L 27/15* (2013.01);
(Continued)

(58) Field of Classification Search
CPC ....... G03B 21/204; G02B 1/11; H01S 5/4087; H01L 33/64
See application file for complete search history.

(56) References Cited

U.S. PATENT DOCUMENTS

| 4,318,058 A | 3/1982 | Mito et al. |
| 4,341,592 A | 7/1982 | Shortes et al. |

(Continued)

FOREIGN PATENT DOCUMENTS

| CN | 1452254 | 4/2003 |
| CN | 1655371 | 8/2005 |

(Continued)

OTHER PUBLICATIONS

Abare "Cleaved and Etched Facet Nitride Laser Diodes," IEEE Journal of Selected Topics in Quantum Electronics, vol. 4, No .3, pp. 505-509 (May 1998).

(Continued)

*Primary Examiner* — Joseph L Williams
(74) *Attorney, Agent, or Firm* — Kilpatrick Townsend & Stockton LLP

(57) ABSTRACT

A structured phosphor device includes a frame member comprising wall regions separating multiple openings of window regions. Further, the structured phosphor device includes a phosphor material filled in each of the multiple openings with a first surface thereof being exposed to an excitation light from one or more laser sources to generate an emitted light out of each window region. Additionally, the structured phosphor device includes an anti-reflective film overlying the first surface of the phosphor material. Furthermore, the structured phosphor device includes a substrate attached to a second surface of the phosphor material in each of the multiple openings. Alternatively, the structured phosphor device includes an array of phosphor pixels dividing a plate of single-crystalline or poly-crystalline phosphor material separated by optically reflective and thermally conductive walls. A dynamic lighting system based on the arrays of phosphor pixels for single or full color image projection is also disclosed.

40 Claims, 12 Drawing Sheets

(51) Int. Cl.

| | |
|---|---|
| *G03B 21/00* | (2006.01) |
| *H01S 5/30* | (2006.01) |
| *H01S 5/40* | (2006.01) |
| *H01L 33/64* | (2010.01) |
| *H01L 33/00* | (2010.01) |
| *H01L 27/15* | (2006.01) |
| *H01S 5/024* | (2006.01) |
| *H01S 5/00* | (2006.01) |

(52) U.S. Cl.
CPC .......... *H01L 33/0045* (2013.01); *H01L 33/64* (2013.01); *H01S 5/0071* (2013.01); *H01S 5/02469* (2013.01); *H01S 5/02476* (2013.01); *H01S 5/3013* (2013.01); *H01S 5/4075* (2013.01); *H01S 5/4087* (2013.01)

(56) References Cited

U.S. PATENT DOCUMENTS

| | | |
|---|---|---|
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Rorie et al. |
| 6,069,394 A | 5/2000 | Hashimoto et al. |
| 6,072,197 A | 6/2000 | Horino et al. |
| 6,147,953 A | 11/2000 | Duncan |
| 6,153,010 A | 11/2000 | Kiyoku et al. |
| 6,167,169 A | 12/2000 | Brinkman et al. |
| 6,195,381 B1 | 2/2001 | Botez et al. |
| 6,239,454 B1 | 5/2001 | Glew et al. |
| 6,283,597 B1 | 9/2001 | Jorke |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,351,478 B2 | 1/2013 | Raring et al. |
| 8,355,418 B2 | 1/2013 | Raring et al. |
| 8,416,825 B1 | 4/2013 | Raring et al. |
| 8,422,525 B1 | 4/2013 | Raring et al. |
| 8,427,590 B2 | 4/2013 | Raring |
| 8,451,876 B1 | 5/2013 | Raring et al. |
| 8,509,275 B1 | 8/2013 | Raring et al. |
| 8,582,038 B1 | 11/2013 | Raring et al. |
| 8,717,505 B1 | 5/2014 | Raring et al. |
| 8,730,410 B1 | 5/2014 | Raring et al. |
| 8,749,719 B2 | 6/2014 | Raring et al. |
| 8,773,598 B2 | 7/2014 | Raring et al. |
| 9,013,638 B2 | 4/2015 | Raring et al. |
| 9,019,437 B2 | 4/2015 | Raring et al. |
| 9,071,772 B2 | 6/2015 | Raring et al. |
| 9,787,963 B2 | 10/2017 | Novotny et al. |
| 2001/0048114 A1 | 12/2001 | Morita et al. |
| 2002/0027933 A1 | 3/2002 | Tanabe et al. |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0012027 A1 | 1/2004 | Keller et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0286591 A1 | 12/2005 | Lee |
| 2006/0030738 A1 | 2/2006 | Vanmaele et al. |
| 2006/0033009 A1 | 2/2006 | Kobayashi et al. |

(56) References Cited

U.S. PATENT DOCUMENTS

| | | |
|---|---|---|
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0284790 A1 | 12/2006 | Tegreene et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenthe et al. |
| 2007/0184637 A1 | 8/2007 | Haskell et al. |
| 2007/0190758 A1 | 8/2007 | Kaeding et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0280320 A1 | 12/2007 | Feezell et al. |
| 2008/0006831 A1 | 1/2008 | Ng |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0143970 A1 | 6/2008 | Harbers et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0067088 A1 | 3/2010 | Novotny et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0273906 A1 | 11/2011 | Nichol et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0022064 A1 | 1/2013 | Raring et al. |
| 2013/0314613 A1 | 11/2013 | Raring et al. |
| 2013/0314614 A1 | 11/2013 | Raring et al. |
| 2014/0226079 A1 | 8/2014 | Raring et al. |
| 2014/0253697 A1 | 9/2014 | Raring et al. |
| 2014/0267937 A1 | 9/2014 | Raring et al. |
| 2014/0293139 A1 | 10/2014 | Raring et al. |
| 2015/0103404 A1 | 4/2015 | Rudy et al. |

FOREIGN PATENT DOCUMENTS

| | | |
|---|---|---|
| CN | 1668947 | 9/2005 |
| CN | 1953197 | 4/2007 |
| JP | 3-287770 | 12/1991 |
| JP | 07-162081 | 6/1995 |
| JP | 2002-185082 | 6/2002 |
| JP | 2002-009402 | 11/2002 |
| JP | 2004-186527 | 2/2004 |
| JP | 2004-152841 | 5/2004 |
| JP | 2004-503923 | 5/2004 |
| JP | 2006-091285 | 6/2006 |
| JP | 2006-120923 | 11/2006 |
| JP | 2007-173467 | 7/2007 |
| JP | 2007-529910 | 10/2007 |
| JP | 2007-068398 | 4/2008 |
| JP | 2008-193057 | 8/2008 |
| JP | 2008-198952 | 8/2008 |
| JP | 2008-543089 | 11/2008 |
| JP | 2008-311640 | 12/2008 |
| JP | 2009-021506 | 1/2009 |

(56) References Cited

FOREIGN PATENT DOCUMENTS

| | | |
|---|---|---|
| JP | 2009-158893 | 7/2009 |
| WO | 2008-041521 | 4/2008 |
| WO | 2010/120819 | 10/2010 |
| WO | 2012/016033 | 2/2012 |
| WO | 2017/062725 A1 | 4/2017 |

OTHER PUBLICATIONS

Adesida et al., "Characteristics of chemically assisted ion beam etching of gallium nitride" Applied Phys. Lett. vol. 65 No. 7 (1994), pp. 889-891.
Aoki et al., "InGaAs/InGaAsP MQW Electroabsorption Modulator Integrated with a DFB Laser Fabricated by Band-Gap Energy Control Selective Area MOCVD, (1993), "IEEE J Quantum Electronics, vol. 29, pp. 2088-2096.
Asano et al., "100-mW kink-Free Blue-Violet Laser Diodes with Low Aspect Ratio," (2003), IEEE Journal of Quantum Electronics, vol. 39, No. 1, pp. 135-140.
Asif Khan "Cleaved cavity optically pumped InGaN-GaN laser grown on spinel substrates," Appl. Phys. Lett. 69 (16), pp. 2418-2420 (Oct. 14, 1996).
Schremer et al., "Progress in Etched Facet Technology for GaN and Blue Lasers" Proc. of SPIE vol. 6473 64731F-3 (2007), 8 pages.
Bernardini et al., "Spontaneous Polarization and Piezoelectric Constants of III-V Nitrides," (1997), Physical Review B, vol. 56, No. 16, pp. 10024-10027.
Caneau et al., "Studies on Selective OMVPE of (Ga,In)/(As,P)," (1992), Journal of Crystal Growth, vol. 124, pp. 243-248.
Chen et al., "Growth and Optical Properties of Highly Uniform and Periodic InGaN Nanostructures," (2007), Advanced Materials, vol. 19, pp. 1707-1710.
D'Evelyn et al., "Bulk GaN Crystal Growth by the High-Pressure Ammonothermal Method," Journal of Crystal Growth, (2007), vol. 300, pp. 11-16.
Franssila, "Tools for CVD and Epitaxy", Introduction to Microfabrication, (2004), pp. 329-336.
Fujii et al., "Increase in the Extraction Efficiency of GaN-based Light-Emitting Diodes Via Surface Roughening," (2004), Applied Physics Letters, vol. 84, No. 6, pp. 855-857.
Funato et al., "Blue, Green, and Amber InGaN/GaN Light-Emitting Diodes on Semipolar (1122) GaN Substrates," (2006), Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," (2008), Applied Physics Express, vol. 1, pp. 011106-1-011106-3.
Founta et al., "Anisotropic Morphology of Nonpolar a-Plane GaN Quantum Dots and Quantum Wells" Journal of Applied Physics, vol. 102, vol. 7, (2007), pp. 074304-1-074304-6.
Gardner et al. "Blue-emitting InGaN-GaN double-heterostructure light-emitting diodes reaching maximum quantum efficiency above 200 A/cm2", Applied Physics Letters 91, 243506 (2007).
Tech On "Nichia Develops Blue-green Semiconductor Laser w/488nm Wavelength" (Jan. 6, 2010) 2 pages www.techon.nikkeibp.coEnglish/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, (May 6, 1999). pp. 104-111.
Iso et al., "High Brightness Blue InGaN/GaN Light Emitting Diode on Nonpolar m-plane Bulk GaN Substrate," (2007), Japanese Journal of Applied Physics, vol. 46, No. 40, pp. L960-L962.
Kendall et al., "Energy Savings Potential of Solid State Lighting in General Lighting Applications," (2001), Report for the Department of Energy, pp. 1-35.
Kim et al, "Improved Electroluminescence on Nonpolar m-plane InGaN/GaN Qantum Well LEDs", (2007), Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," (2007), Journal of Japanese Applied Physics, vol. 40, pp. 925-927.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", (1998), Applied Physics Letters, vol. 72, No. 12, pp. 211-213.
Nam et al., "Later Epitaxial Overgrowth of GaN films on SiO2 Areas Via Metalorganic Vapor Phase Epitaxy," (1998), Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," (2007), Journal of Japanese Applied Physics, vol. 46, No. 35, pp. 820-822.
Okamoto et al., "Continuous-Wave Operation of m-Plane InGaN Multiple Quantum Well Laser Diodes" The Japan Society of I Applied Physics JJAP Express Letter, vol. 46, No. 9, (2007) pp. L 187-L 189.
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells," Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, (Nov. 2005).
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," (2007).Physica Status Solidi (RRL), vol. 1, pp. 162-164.
Sato et al., "Optical Properties of Yellow Light-Emitting-Diodes Grown on Semipolar (1122) Bulk GaN Substrate," (2008), Applied Physics Letter, vol. 92, No. 22, pp. 221110-1-221110-3.
Schmidt et al., "Demonstration of Nonpolar m-plane InGaN/GaN Laser Diodes," (2007), Journal of Japanese Applied Physics, vol. 46, No. 9, pp. 190-191.
Schmidt et al., "High Power and High External Efficiency m-plane InGaN Light Emitting Diodes," (2007), Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN-GaN Light-emitting Diodes," (2006), Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," (2009), Applied Physics Express, vol. 2, pp. 071001-1-071001-3.
Tomiya et al., "Dislocation related issues in the degradation of GaN-based laser diodes," IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," (2007), Japanese Journal of Applied Physics, vol. 46, No. 7, pp. L129-L131.
Tyagi et al., "Semipolar (1011) InGaN/GaN Laser Diodes on Bulk GaN Substrates," Japanese Journal of Applied Physics, vol. 46, No. 19, (2007), pp. L444-L445.

(56) References Cited

OTHER PUBLICATIONS

Uchida et al., "Recent Progress in High-Power Blue-violet Lasers," (2003), IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," (2000), Nature: International Weekly Journal of Science, vol. 406, pp. 865-868.
Wierer et al., "High-power AlGaInN Flip-chip Light-emitting Diodes," (2001), Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," (2008), Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," (2007), Electron Letter, vol. 43, No. 15, pp. 825-826.
Zhong et al., "High Power and High Efficiency Blue Light Emitting Diode on Freestanding Semipolar (1122) Bulk GaN Substrate," (2007), Applied Physics Letter, vol. 90, No. 23, pp. 233504-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion ofPCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
International Search Report of PCT Application No. PCT/US2011/060030, dated Mar. 21, 2012, 11 pages.
Non-Final Office Action dated Sep. 24, 2012 for U.S. Appl. No. 12/789,303, 19 pages.
Notice of Allowance dated Dec. 21, 2012 for U.S. Appl. No. 12/789,303, 7 pages.
Notice of Allowance dated Sep. 3, 2013 for U.S. Appl. No. 13/853,694, 12 pages.
Notice of Allowance dated Dec. 10, 2013 for U.S. Appl. No. 13/739,961, 15 pages.
Notice of Allowance dated Jan. 11, 2014 for U.S. Appl. No. 14/035,045, 9 pages.
Notice of Allowance dated Jan. 24, 2014 for U.S. Appl. No. 13/678,101, 12 pages.
Notice of Allowance dated Mar. 4, 2014 for U.S. Appl. No. 13/678,122, 31 pages.
Non-Final Office Action dated Oct. 8, 2014 for U.S. Appl. No. 14/199,672, 22 pages.
Non-Final Office Action dated Dec. 22, 2014 for U.S. Appl. No. 14/262,208, 25 pages.
Notice of Allowance dated Feb. 27, 2015 for U.S. Appl. No. 14/307,214, 9 pages.
Notice of Allowance dated Feb. 2, 2015 for U.S. Appl. No. 14/199,672, 7 pages.
Notice of Allowance dated Apr. 23, 2015 for U.S. Appl. No. 14/262,208; 5 pages.
International Search Report and Written Opinion of PCT Application No. PCT/US2016/055920, dated Nov. 3, 2016, 13 pages.

STRUCTURED PHOSPHORS FOR DYNAMIC LIGHTING

BACKGROUND

Recently, static and dynamic lighting systems based on laser sources and pumped phosphors are receiving attention as power sources and display devices due to availability of power efficient laser pumping sources and conversion phosphors. The static lighting system includes a laser source that delivers required illumination and phosphor material that generates white or colored light. The dynamic lighting system of this type includes the similar laser source and the optical scanner that directs the excitation light to the phosphor material to create desired images or a full monochromatic or color projection display. The dynamic lighting system also can control not only the position of emitted light, but also its duration, repetition rate and intensity.

Compared with conventional lighting systems including those that are light emitting diode based, the laser-based and phosphor-pumped lighting source is characterized by very high beam quality with very low beam divergence. Using these laser-based and phosphor-pumped lighting sources with higher power, efficiency, and coherence, high quality images can be formed. The challenge with these laser-based and phosphor-pumped lighting systems is lateral spreading of emitted light in the phosphor material or device that leads to diffuse spots or crosstalk between adjacent pixels in the projection display devices.

Although useful, the pumped phosphor material or devices still have limitations in application for display and thermal degradation that are desirable to overcome in accordance to the following disclosure.

SUMMARY

The present invention provides a structured phosphor device and fabrication methods thereof. Particularly, the invention provides an array of pixelated phosphor devices for independently emitting white colored electromagnetic radiation using laser diode excitation sources based on gallium and nitrogen containing materials. Methods for fabricating the structured phosphor devices and architectures of dynamic lighting systems for color projection displays using the structured phosphors are illustrated that substantially obviate one or more of the problems due to limitations and disadvantages of the related art.

In an embodiment, the present disclosure provides a structured phosphor device. The structured phosphor device includes a phosphor configured for laser excitation. The phosphor includes an array of pixel regions separated by boundary regions. One or more pixel regions of the array of pixel regions are designed to be addressed by a laser light beam incident through a first surface of the phosphor into phosphor material thereof and generate at least a partially converted light emission from the phosphor material. The boundary regions are configured to limit the cross-talk of the laser light beam between the one or more addressed pixel regions and adjacent pixel regions. The structured phosphor device further includes a surface treatment applied to the first surface of the phosphor. Additionally, the structured phosphor includes a substrate attached to a second surface of the phosphor.

In another embodiment, the present disclosure provides a structured phosphor device. The structured phosphor device includes a frame member including wall regions separating multiple openings of window regions. The structured phosphor device further includes a phosphor material filled in each of the multiple openings with a first surface thereof being exposed to an excitation light from one or more laser sources to generate an emitted light out of each window region. Additionally, the structured phosphor device includes a surface treatment applied to the first surface of the phosphor material. Furthermore, the structured phosphor device includes a substrate attached to a second surface of the phosphor material and wall regions.

In yet another embodiment, the present disclosure provides a pixelated phosphor device. The pixelated phosphor device includes a plate of phosphor material configured to an array of pixels being mutually separated by a thin wall. The pixelated phosphor device further includes a first optical layer overlying a first surface of the plate of phosphor material which is subjected to an excitation light beam for inducing an emitted light beam out of each of the array of pixels. Additionally, the pixelated phosphor device includes a second optical layer overlying a second surface of the plate of phosphor material. The second surface is opposed to the first surface. Furthermore, the pixelated phosphor device includes a substrate attached to the second optical layer.

In still another embodiment, the present disclosure provides a method of projecting an image out of a pixelated phosphor. The method includes providing a pixelated phosphor including an array of pixel regions separated by boundary regions. The method further includes attaching a substrate via a bonding layer to a second surface of the pixelated phosphor. Additionally, the method includes disposing at least one laser device based on Ga and N material to generate a laser light. The method also includes modulating and guiding the laser light to the first surface of the pixelated phosphor as an incident light beam to individually excite each of the array of pixel regions of the pixelated phosphor to generate an emitted light beam. The boundary regions are configured to limit cross-talk of the incident light beam across neighboring pixel regions. Moreover, the method includes combining all emitted light beams from the array of pixel regions of the pixelated phosphor to project an image of at least one color per scan cycle.

In yet still another embodiment, the present disclosure provides a method of forming a structured phosphor device. The method includes providing a plate of phosphor material of a thickness and attaching a substrate via a bonding layer to a second surface of the plate of phosphor material. The method further includes patterning the plate of phosphor material to define an array of unit regions bounded by wall regions. Additionally, the method includes removing the phosphor material in the wall regions through the thickness of the plate of phosphor material to form trenches separating an array of phosphor pixels in the array of unit regions. The method also includes coating side walls of the trenches with an optically reflective film. Furthermore, the method includes filling the trenches with a thermally conductive material to form a wall separating each phosphor pixel from its neighboring phosphor pixels. Moreover, the method includes treating a surface layer overlying a first surface of the array of phosphor pixels.

In an alternative embodiment, the present disclosure provides a dynamic lighting system for image projection display. The dynamic lighting system includes a laser diode device, characterized by a wavelength. The dynamic lighting system further includes a lens coupled to an output beam of the laser diode device and a scanning mirror device operably coupled to the output beam of the laser diode device. Additionally, the dynamic lighting system includes a structured phosphor device described herein containing multiple phosphor pixels coupled to the scanning mirror device and configured to be addressed and excited by the output beam to produce an emitted beam of one color. Furthermore, the dynamic lighting system includes an image subsystem for generating an image based on the emitted beams of one color respectively from at least a portion of the multiple phosphor pixels selected by beam modulation and movement of the scanning mirror device.

In another alternative embodiment, the present disclosure provides a dynamic lighting system for image projection display. The dynamic lighting system includes a laser diode device, characterized by a wavelength and modulated light intensities, and includes a lens coupled to an output beam of the laser diode device. The dynamic lighting system further includes a scanning mirror device operably coupled to the output beam of the laser diode device. Additionally, the dynamic lighting system includes a first structured phosphor device described herein containing multiple first phosphor pixels coupled to the scanning mirror device and configured to be addressed and excited by the output beam to produce a first emitted beam of a first color. The dynamic lighting system further includes a second structured phosphor device described herein containing multiple second phosphor pixels coupled to the first structured phosphor device and configured to be addressed and excited by the output beam to produce a second emitted beam of a second color. Furthermore, the dynamic lighting system includes a third structured phosphor device described herein containing multiple third phosphor pixels coupled to the second structured phosphor device and configured to be addressed and excited by the output beam to produce a third emitted beam of a third color. The dynamic lighting system also includes a first two-state mirror coupled to the scanning mirror to guide the output beam to a selected one of the multiple first phosphor pixels at an on-state or pass the output beam at an off-state. Moreover, the dynamic lighting system includes a second two-state mirror coupled to the first two-state mirror to guide the output beam passed by the first two-state mirror to a selected one of the multiple second phosphor pixels at an on-state or pass the output beam at an off-state. Further, the dynamic lighting system includes a fixed mirror coupled to the second two-state mirror to guide the output beam passed by the second two-state mirror to a selected one of the multiple third phosphor pixels. Also, the dynamic lighting system includes an image subsystem for generating an image based on a combination of the first emitted beam, the second emitted beam, and the third emitted beam from respective one of the multiple first, second, and third phosphor pixels selected by movements of the scanning mirror device, the first two-state mirror, the second two-state mirror, and the fixed mirror in certain controlled rates.

In yet another alternative embodiment, the present disclosure provides a dynamic lighting system for image projection display. The dynamic lighting system includes three laser diode devices characterized by three wavelengths and modulated light intensities, and includes three lenses coupled respectively to three modulated output beams of the three laser diode devices. The dynamic lighting system further includes three scanning mirror devices operably coupled to the three modulated output beams respectively. Additionally, the dynamic lighting system includes three structured phosphor devices described herein respectively including multiple phosphor pixels of three colors. The three structured phosphor devices are coupled to three scanning mirror devices and configured to be individually addressed and excited respectively by the three modulated output beams to produce emitted beams of three colors. Further-more, the dynamic lighting system includes an image subsystem for generating an image based on a combination of the three emitted beams of three colors from respective three of multiple phosphor pixels of three colors selected by movements of the three scanning mirror devices in certain controlled rates.

A further understanding of the nature and advantages of the present invention may be realized by reference to the latter portions of the specification and attached drawings.

DETAILED DESCRIPTION

Figure 1A:
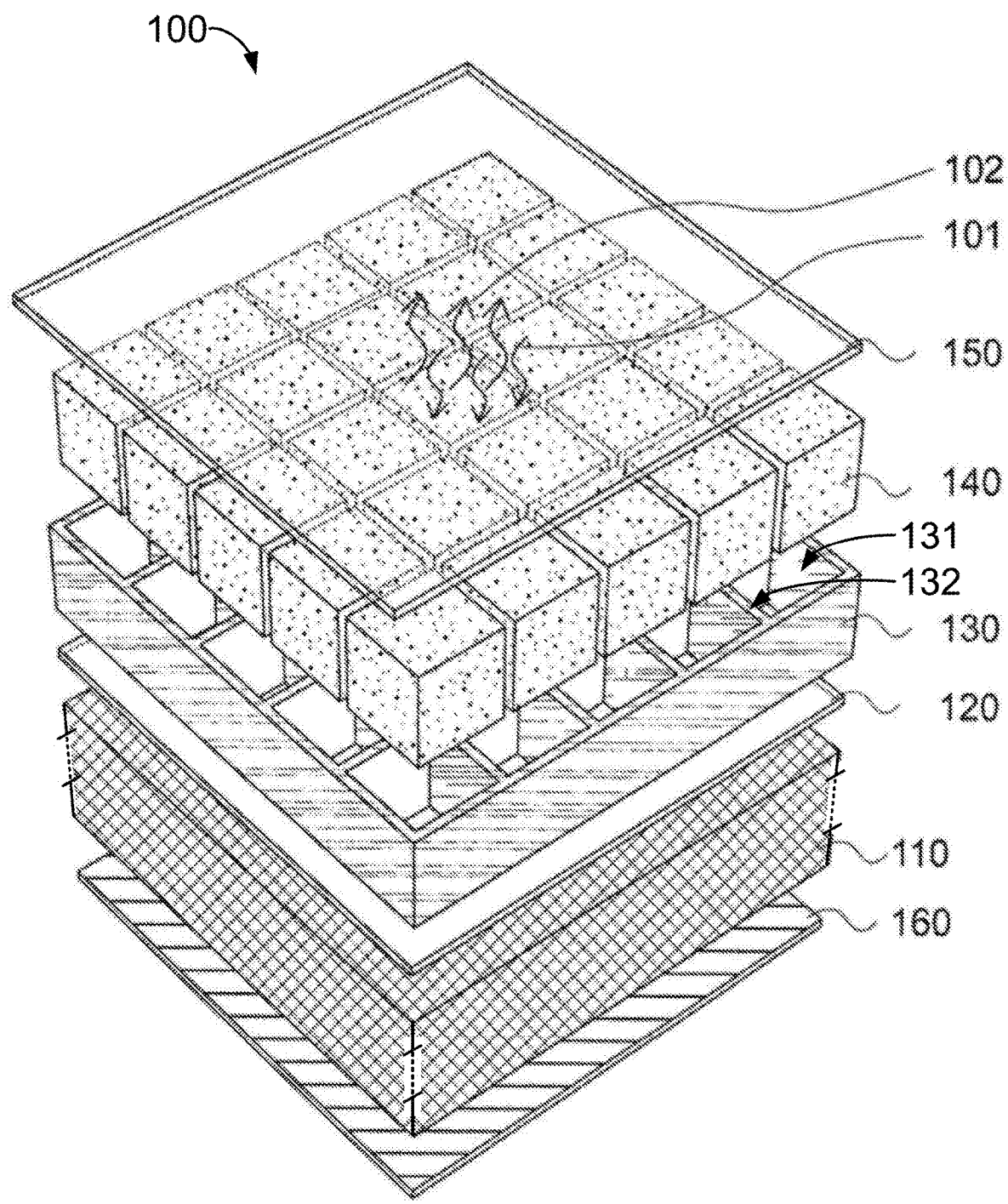
FIG. 1A is an exploded view of a structured phosphor device operated under a reflective-mode with perpendicular walls of window frames according to an embodiment of the disclosure.

The present invention provides structured phosphor devices and fabrication methods thereof. Particularly, the invention provides an array of pixelated phosphor devices for independently emitting white colored electromagnetic radiation using a combination of laser diode excitation sources based on gallium and nitrogen containing materials. Methods for fabricating the structured phosphor devices and architectures of dynamic lighting systems for color projection displays using the structured phosphor devices are illustrated that substantially obviate one or more of the problems due to limitations and disadvantages of the related art.

As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm$^2$ range. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm$^2$ to 30 mm$^2$ of epi area. A second limitation of LEDs is also related to their brightness', more specifically it is related to their spatial brightness. A conventional high brightness LED emits ~1 W per mm$^2$ of epi area. With some advances and breakthrough perhaps this can be increased up to 5-10× to 5-10 W per mm$^2$ of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 μm wide by about 0.5 μm tall, which equates to over 250,000 W/mm$^2$. This spatial brightness is over 5 orders of magnitude higher than LEDs or put another way, 10,000 times brighter than an LED.

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Based on essentially all the pioneering work on GaN LEDs described above, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter, which are still relatively small compared to the 6" and greater diameters that are commercially available for mature substrate technologies. Further details of the present invention can be found throughout the present specification and more particularly below.

Additional benefits are achieved over pre-existing techniques using the present invention. In particular, the present invention enables a cost-effective white light source and white light and color displays. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount. In some embodiments the light source and phosphor are configured on a common support member wherein the common support member may be a package member.

In various embodiments, the laser device and phosphor device are mounted on a common support member with or without intermediate submounts and the phosphor materials are operated in a transmissive mode, a reflective mode, or a side-pumped mode to result in a laser-based white light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, color or white light beam projectors and displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) more than 10,000 times higher than conventional LEDs, extreme directionality of the laser emission, and without the droop phenomenon that plagues LEDs, laser diodes enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 microns in diameter, less than 100 microns in diameter, or even less than 50 microns in diameter, power densities of over 1 W/mm$^2$, 100 W/mm$^2$, or even over 2,500 W/mm$^2$ can be achieved. These power densities are somewhat arbitrary as they do not correspond to combinations of powers and diameters given above. When this very small and powerful beam of laser excitation light is incident on a phosphor material or device an extremely bright spot or point source of white light can be achieved. Assuming a phosphor conversion ratio of 200 lumens of emitted white light per optical watt of excitation light, a 5 W excitation power could generate 1000 lumens in a beam diameter of 100 microns, or 50 microns, or less. This unprecedented source brightness can be game changing in applications such as spotlighting or range finding where parabolic reflectors or lensing optics can be combined with the point source to create highly collimated white light spots that can travel drastically longer distances than ever possible before using LEDs or bulb technology.

In one embodiment, the present invention provides a CPoS laser-based white light source comprising a form factor characterized by a length, a width, and a height. In an example, the height is characterized by a dimension of less than 25 mm, and greater than 0.5 mm, although there may be other variations. In an alternative example, the height is characterized by a dimension of less than 12.5 mm, and greater than 0.5 mm, although there may be other variations. In yet an alternative example, the length and width are characterized by a dimension of less than 30 mm, less than 15 mm, or less than 5 mm, although there may be other variations. The apparatus has a support member and at least one gallium-and-nitrogen-containing laser diode devices and phosphor material in single device or array of pixelated phosphor devices overlying the support member. The laser diode device is capable of providing an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In some embodiments, two or more laser diodes or laser stripes are included in the white light source. In some embodiments, circular beams can be also obtained from elliptical beams by optical beam shaping with appropriate lens systems. Combining multiple laser sources can offer many potential benefits according to this invention. First, the excitation power can be increased by beam combining to provide a more powerful excitation source and hence produce a brighter light source. Similarly, the reliability of the white light source can be increased by using multiple laser sources at lower drive conditions to achieve the same excitation power as a single laser source driven at more harsh conditions such as higher current and voltage. A second advantage is the potential for a more circular spot by rotating the first free space diverging elliptical laser beam by 90 degrees relative to the second free space diverging elliptical laser beam and overlapping the centered ellipses on the phosphor material or device. Alternatively, a more circular spot can be achieved by rotating the first free space diverging elliptical laser beam by 180 degrees relative to the second free space diverging elliptical laser beam and off-centered overlapping the ellipses on the phosphor device to increase spot diameter in slow axis diverging direction. In another configuration, more than 2 laser beams are included and some combination of the above described beam shaping spot geometry shaping is achieved. A third advantage is that multiple color or wavelength lasers can be included to offer improved performance such as an improved color rendering or color quality. For example, two or more blue excitation lasers with slightly detuned wavelengths (e.g. 5 nm 10 nm, 15 nm, etc.) can be included to create a larger blue spectrum. In one embodiment, separate individual laser chips are configured within the white light source. By positioning multiple laser chips in a predetermined configuration, multiple excitation beams can be overlapped on the spot on the phosphor device to create a more ideal spot geometry. In alternative embodiments, laser diodes with multiple adjacent laser stripes, i.e., multi-stripe lasers, are included in white light source. The multiple stripes can enable an increased excitation power for a brighter white light source and/or an improved or modified spot pattern on the phosphor material. In a preferred embodiment the phosphor material can provide a yellowish emission in the 550 nm to 590 nm range such that when mixed with the blue emission of the laser diode a white light is produced. In other embodiments, phosphors with red, green, yellow, and even blue emission can be used in combination with the laser diode excitation source to produce a white light with color mixing.

In an embodiment, a super-luminescent light emitting diode or SLED can be used as phosphor excitation sources for forming the white light source. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode. The emission spectral width is typically substantially wider (>5 nm) than that of a laser diode and offer advantages with respect to reduced image distortion in displays, increased eye safety, and enhanced capability in measurement and spectroscopy applications.

SLEDs are designed to have high single pass gain or amplification for the spontaneous emission generated along the waveguide. The SLED device would also be engineered to have a low internal loss, preferably below 1 $cm^{-1}$, however SLEDs can operate with internal losses higher than this. In the ideal case, the emitting facet reflectivity would be zero, however in practical applications a reflectivity of zero is difficult to achieve and the emitting facet reflectivity is designed to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide high flexibility for facet angle determination. Alternatively, a very common method to achieve an angled output for reduced constructive interference in the cavity would be to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet. A low reflectivity facet may also be formed by roughening the emitting facet in such a way that light extraction is enhanced and coupling of reflected light back into the guided modes is limited. SLEDs are applicable to all embodiments according to the present invention and the device can be used interchangeably with laser diode device when applicable.

The white light source typically has a free space with a non-guided laser beam characteristic transmitting the emission of the laser beam from the laser device to the phosphor material or device. The laser beam spectral width, wavelength, size, shape, intensity, and polarization are configured to excite the phosphor material or device. The beam can be configured by positioning it at the precise distance from the phosphor device to exploit the beam divergence properties of the laser diode and achieve the desired spot size. In one embodiment, the incident angle from the laser to the phosphor device is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor device can be optimized to stretch the beam in the slow axis direction such that the beam is more circular on phosphor device. In alternative embodiments laser diodes with multiple parallel adjacent emitter stripes can be configured to result in a wider and/or more powerful excitation spot on the phosphor device. By making the spot wider in the lateral direction the spot could become more circular to the faster divergence angle of the laser emission in the perpendicular direction. For example, two or more laser stripes may be spaced by 10-30 μm, 30-60 μm, 60-100 μm, or 100-300 μm. In some embodiments the parallel stripes have slightly detuned wavelengths for an improved color quality. In other embodiments free space optics such as collimating lenses can be used to shape the beam prior to incidence on the phosphor device. In one example, a re-imaging optic is used to reflect and reshape the beam onto the phosphor device. In an alternative example, the otherwise wasted reflected incident light from the phosphor device is recycled with a re-imaging optic by being reflected back to the phosphor device.

In an embodiment, the excitation beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization state, but can have other meanings consistent with ordinary meaning.

In another embodiment, the excitation light beam that incidents on the phosphor has a power of greater than 0.1 W, or greater than 0.1 W, or greater than 0.5 W, or greater than 1 W, or greater than 5 W, or greater than 10 W, or greater than 20 W.

In some embodiments, the phosphor material or device can be operated in a transmissive mode, a reflective mode, or a combination of a transmissive mode and reflective mode, or a side-pumped mode, or other modes. The phosphor material is characterized by conversion efficiency, a resistance to thermal damage, a resistance to optical damage, a thermal quenching characteristic, a porosity to scatter excitation light, and a thermal conductivity. The phosphor device may have an intentionally roughened surface to increase the light extraction from the phosphor material. Optionally, an anti-reflective coating for the emitted light can be applied to improve light extraction from the phosphor material. Although the emitted light from the phosphor material is a quite broad spectrum and has wide range of emitted angles, the anti-reflective coating is able to allow transmission for major wavelengths of the emitted light through the coating. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light source also has an electrical input interface configured to couple electrical input power to the laser diode device to generate the laser beam and excite the phosphor material. The white light source can be configured to produce greater than 1 lumen, 10 lumens, 100 lumens, 1000 lumens, 2000 lumens, or greater of white light output. The support member is configured to transport thermal energy from at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, alumina, SiC, sapphire, AN, or other metals, ceramics, or semiconductors.

In a preferred configuration of this white light source, the common support member comprises the same submount that the gallium-and-nitrogen-containing laser diode chip is directly bonded to. That is, the laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The laser diode can be attached to a first surface of the submount using conventional die attaching techniques using solders such as AuSn solder, SAC solder such as SAC305, lead containing solder, or indium, or other bonding materials. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/m·K and electrical conductivity of about 16 micro-ohm×cm whereas pressureless sintered Ag can have a thermal conductivity of about 125 W/m·K and electrical conductivity of about 4 micro-ohm·cm, or pressured sintered Ag can have a thermal conductivity of about 250 W/m·K and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Similarly, the phosphor material may be bonded to the submount using a soldering technique, or a sintered Ag technique, but it can be other techniques such as gluing technique or metal filled (such as silver) epoxy technique. Typically, thermal interface between the phosphor and the submount and between the submount and a heat sink will dominate thermal impedance. The example of desirable interface is metallized phosphor with solder bonding two members together. Optimizing the bond interface for the lowest thermal impedance is a key parameter for heat dissipation from the phosphor material, which is critical to prevent phosphor degradation and thermal quenching of the phosphor material.

In some embodiments, a phosphor is structured or patterned with multiple phosphor pixel regions and separated by boundary regions. The multiple phosphor pixel regions can be operated in a reflective or transmissive mode to be applied in a dynamic lighting system for single or full color image projection displays with the multiple phosphor pixel regions being individually addressed by laser excitation with reduced diffusivity and crosstalk from one pixel to another. Optionally, the multiple phosphor pixel regions are powdered phosphor material filled within an array of window frame structures and later sintered into a solid form. Optionally, the multiple phosphor pixel regions are made by patterning and dividing a plate of single or poly crystalline phosphor material separated by the boundary regions. Additionally, the structured or patterned phosphor device includes an antireflective multilayer film for the blue and white light formed on a first surface of the phosphor facing an in-coming excitation radiation from one or more laser sources. Furthermore, for the structured or patterned phosphor operated in reflective mode, the window frame structure or the material for forming the boundary regions is highly optical reflective and thermally conductive or at least includes a thermally conductive core coated by a highly reflective film for specific range of wavelengths, e.g., blue or white light. Moreover, a highly reflective multilayer film for blue and white light is disposed between a second surface (opposed to the first surface) of the phosphor and a substrate. A thermally conductive material is used for the substrate. Alternatively, for the structured or patterned phosphor device in transmissive mode, an antireflective film for white light is disposed at the second surface for each of the multiple phosphor pixel regions and a thermally conductive as well as optically transparent material is used for the substrate.

In some embodiments, the structured phosphor device includes an array of pixel regions configured with uniform size and shape. Each pixel region has a size of less than 1 mm×1 mm, or less than 500 µm×500 µm, or less than 250 µm×250 µm, or less than 100 µm×100 µm, or even less than 10 µm×10 µm. Optionally, each pixel region has a square shape, a rectangular shape, a hexagon shape, or other regular shapes. Optionally, each pixel region contains a phosphor material of a thickness of 100-200 µm. Each pixel region is configured to receive an incident light from laser excitation from one or more laser sources based on GaN diodes or other laser diodes. The laser excitation is configured to have a power of at least 0.1 W, or greater than 1 W, or greater than 5 W, or greater than 10 W, or greater than 20 W. Optionally, the boundary regions is optimally made to be substantially small in width to minimize its volume comparing to that of the multiple pixel regions. Optionally, the width of the boundary region can be made to be as small as a few microns.

In an alternative embodiment, the structured phosphor device with multiple phosphor pixels operated in a reflective or transmissive mode are applied for forming a dynamic lighting system with a single (white) color image display, or full color image display with one laser source, or full color image display with multiple laser sources. In one example, a violet laser diode configured to emit a wavelength of 395 nm to 425 nm and excite a first blue structured phosphor device and a second yellow structured phosphor device. In this configuration, the blue structured phosphor device is a first blue phosphor plate being structured or patterned into an array of blue phosphor pixels and the yellow structured phosphor device is a second yellow phosphor plate being patterned into another array of yellow phosphor pixels. Optionally, the first blue phosphor plate could be fused or bonded to the second yellow phosphor plate. In a practical configuration the laser beam would be directly incident on the first blue phosphor plate wherein a fraction of the blue emission would excite the second yellow phosphor plate to emit yellow emission to combine with blue emission and generate a white light. Additionally, the laser light from the violet laser diode would essentially all be absorbed since what may not be absorbed in the blue structured phosphor device would then be absorbed in the yellow structured phosphor device. In an alternative configuration the laser beam would be directly incident on the second yellow structured phosphor plate wherein a fraction of the violet electromagnetic emission would be absorbed in the second yellow phosphor plate to excite yellow emission and the remaining violet emission would pass to the first blue structured phosphor plate and create a blue emission to combine a yellow emission with a blue emission and generate a white light. In an alternative embodiment, a powdered mixture of phosphor materials would be disposed onto a transparent plate or into a solid structure using a binder material such that the different colored structured phosphor devices such as blue phosphor plate and yellow phosphor plate are co-mingled and are configured to emit a white light when excited by the violet laser beam. The powdered mixture phosphor materials could be comprised of YAG based phosphors, LuAG phosphors, and other phosphors.

In a specific embodiment, the structured phosphor device with multiple phosphor pixels operated in a transmissive mode can be configured for laser excitation from a blue laser diode operating with a wavelength of 425 nm to 480 nm. The blue laser light is configured to excite a first green phosphor and a second red phosphor. In this configuration, a first green phosphor plate with multiple green phosphor pixels could be fused or bonded to the second red phosphor plate with multiple red phosphor pixels. Each pixel can be individually addressed by an incident beam of the blue laser light. In a practical configuration the incident beam would be directly guided to a first addressed pixel of the first green phosphor plate to emit a green emission while a fraction of the green emission would be directed to a second addressed pixel the second red phosphor plate to emit a red emission which is combined with the green emission and a portion of original blue emission to generate a white light. In an alternative practical configuration the blue laser light would be directly incident on a pixel of the second red phosphor plate wherein a fraction of the blue emission would be absorbed in the red phosphor pixel to excite a red emission and a portion of the remaining blue laser emission would pass to a pixel of the green phosphor plate and create a green emission which is combined with the red emission and blue emission to generate a white light. In an alternative embodiment, a powdered mixture of phosphors would be dispensed onto multiple window regions of a transparent plate and sintered into a solid structure in each window region using a binder material at certain elevated temperatures or pressures such that the different color phosphor pixels such as red and green phosphor pixels are co-mingled and are configured to emit a white light when excited by and combined with the blue laser beam. The powdered phosphors could be comprised of YAG based phosphors, LuAG phosphors, and other phosphors. The benefit or feature of this embodiment is the higher color quality that could be achieved from a white light comprised of red, green, and blue emission. Of course, there could be other variants of this invention including integrating more than two phosphors and could include one of or a combination of a red phosphor, green phosphor, blue phosphor, and yellow phosphor.

In several embodiments according to the present invention, the laser based white light sources is configured as a high CRI white light source with a CRI over 70, over 80, or over 90. In these embodiments, multiple phosphor devices are used in the form of a mixed-power-phosphor-material composition or multiple-phosphor-plates configuration or others. Examples of such multiple phosphor materials or devices include, but are not limited to YAG, LuAG, red nitrides, aluminates, oxynitrides, $CaMgSi_2O_6:Eu^{2+}$, BAM: $Eu^{2+}$, $AlNEu^{2+}$, $(Sr,Ca)_3MgSi_2O_8:Eu^{2+}$, and JEM.

In some configurations of this embodiment the phosphor is attached to the common support member wherein the common support member may not be fully transparent. In this configuration the surface or side of the phosphor where it is attached would have impeded light emission and hence would reduce the overall efficiency or quality of the point source white light emitter. However, this emission impediment can be minimized or mitigated to provide a very efficient illumination. In other configurations, the phosphor is supported by an optically transparent member such that the light is free to emit in all directions from the phosphor point source. In one variation, the phosphor is fully surrounded in or encapsulated by an optically transparent material such as a solid material like SiC, diamond, GaN, or other, or a liquid material like water or a more thermally conductive liquid.

In an embodiment, a structured phosphor device in reflective mode containing an array of pixelated phosphors is shown in FIG. 1A in exploded view. The structured phosphor device 100 is a multilayer structure with a multi-unit or pixelated configuration formed on a substrate 110. Optionally, the multi-unit configuration is realized via a window frame member 130 including multiple window regions 131 separated by a wall region (or boundary region) 132. Each of the multiple window regions 131 is filled with a phosphor material 140. Optionally, the multi-unit configuration is realized by dividing a single plate of phosphor material into array of units. Each unit is a phosphor pixel 140 separated by thin boundary walls 132 of optically reflective and thermally conductive material from other neighboring phosphor pixels. Optionally, the device is intended for an application to have the phosphor material 140 to be exposed to a laser beam 101 illuminated from a laser source (not shown in FIG. 1A). The description of structure or apparatus of using illumination of GaN-based blue laser for exciting un-patterned phosphor material can be found from U.S. Pat. No. 9,787,963, commonly assigned to Soraa Laser Diode Inc. and incorporated herein by reference. The incident laser beam 101 coupled with an optical scanning device (not shown) can be guided to individual addressed phosphor pixels 140 for exciting the phosphor material to generate an emitted light beam 102 with emission spectra having longer wavelengths than the excitation wavelengths of the incident laser beam 101. Optionally, as shown in FIG. 1A, the pixelated phosphor structure 100 is reflective in nature such that the emitted light beam 102 is reflected and outputted from a same surface that receives the incident laser beam 101.

Optionally, the substrate 110 is made by a highly thermally conducting material for efficiently dissipating heat inside the phosphor material 140 generated in the above excitation process to a heat sink (attached to the substrate 110). Optionally, the substrate 110 is made by a material that is also characterized by high optical reflectivity at the excitation wavelengths of the incident laser beam 101 and over the emission spectra of emitted light beam 102 from the phosphor material 140. Optionally, if the substrate 110 does not have high optical reflectivity at excitation wavelengths and over the emission spectra from the phosphor material 140, a highly reflective layer 120 composed of a single film or multilayer structure is included between a second surface of the phosphor material 140 surrounded by the wall region 132 of the window frame member 130 and a first surface of the substrate 110.

Optionally, the multi-unit configuration of the window frame member 130 includes an array of uniformly sized window regions 132 that allows the phosphor material 140 filled therein to form an array of phosphor pixels, each phosphor pixel 140 being capable of independently generating the emitted light beam 102. Collectively, the emitted light beams from the array of phosphor pixels 140 are used to display an image with increased and controllable resolution for many dynamic display applications. In a specific embodiment, the window frame member 130 is configured to occupy minimum volume compared with the volume of the array of phosphor pixels 140. In other words, the wall region 132 of the window frame member 130 is made to be substantially thinner relative to the window regions 131.

The high thermal conductivity of the window frame member 130, combined with high thermal conductivity of the substrate 110, helps to efficiently remove heat generated by light absorption in the phosphor pixels 140. The high optical reflectivity at excitation and emission wavelengths makes minimum amount of light to be lost (absorbed) by the window frame member 130 and keeps the light generated in each phosphor pixel 140 not to be spread into adjacent pixels. Thus, the high power efficiency of each emitted light beam 102 can be maintained, and the optical crosstalk between pixels is substantially eliminated. In a specific embodiment, an antireflective coating 150 is disposed on a first surface of the array of phosphor pixels 140 and wall regions 131 of the window frame member 130. The antireflective coating 150 is composed of a single film. Optionally, the antireflective coating 150 is made of a multilayer film including non-absorbing materials with alternating high and low refractive indices. For example, the antireflective coating 150 is made by alternating layers of silicon dioxide and titanium pentoxide. Optionally, the antireflective coating 150 is configured to allow that both the excitation light (of incident laser beam 101) as well as emitted light beam 102 are minimally reflected from the surface of the phosphor pixels 140. Optionally, the antireflective coating 150 is replaced by a surface layer modified by a roughening treatment on the first surface of the array of phosphor pixels 140. Optionally, a combination of anti-reflective coating and surface roughening is applied to the first surface of the array of phosphor pixels 140.

In an embodiment, the shape of each phosphor pixel 140 is depicted in square shape in FIG. 1A. Optionally, the pixel shape shown in FIG. 1A can be any shape including rectangle, hexagon, multi-side polygon, and other shapes that are defined by a photolithography process or by a direct laser writing process in a method for fabricating the structured phosphor device 100. Optionally, the wall regions 131 are substantially perpendicular to the surface of the phosphor pixel although sloped wall can be provided too. More details about the method will be found throughout the specification and particularly below.

In another embodiment, the size of each phosphor pixel 140 is defined primarily by patterning and by etching processes that form the window regions 131 of window frame member 130 or directly divide a plate of phosphor material. Optionally, the size of the phosphor pixel can be as small as 5-10 μm or so depending on applications. The size of the whole pixel array is optionally dependent on the fabrication methodology and optionally dependent on the size of available plates of phosphor material. Optionally, the size of the array of pixelated phosphor devices can vary from few numbers of pixels for low-resolution display application to a full high-resolution array (such as 1024×1920 pixels) for high-resolution full-color display applications. For example, a typical array of pixelated phosphor devices can be an array of 100×100 pixels with a square shape pixel size of 100 μm×100 μm and a thickness in a range of 100 to 200 μm that depends on absorption coefficient of phosphor material at the excitation wavelengths. Optionally, the pixelated phosphor devices can be formed in other shapes, e.g., rectangular shape, multi-sides polygon shape, circular shape, oval shape, etc., with respective ways to measure its size according to its shape.

Figure 1B:
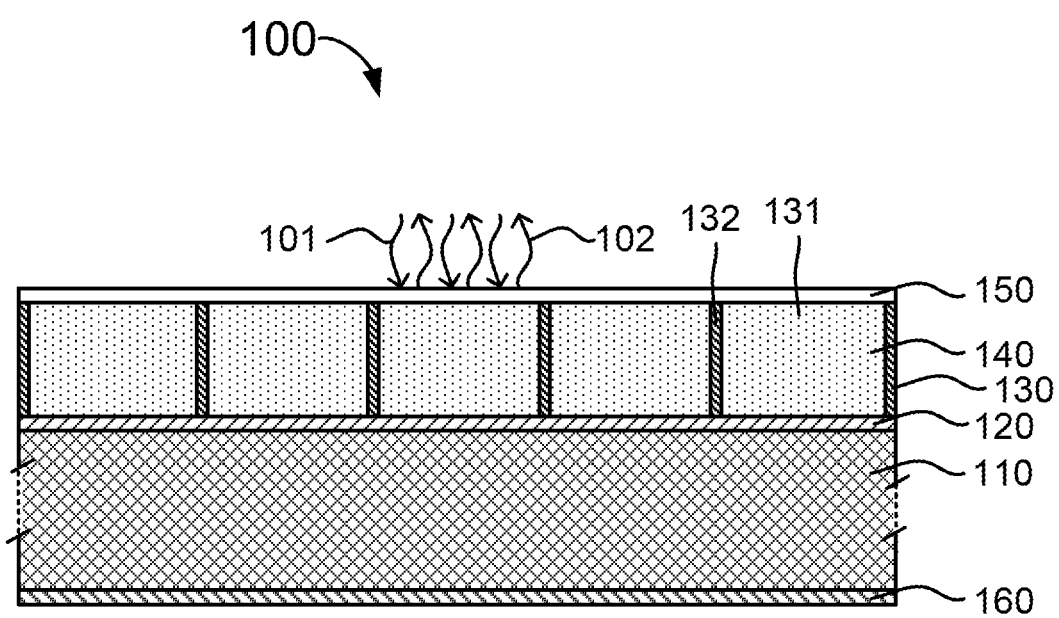
FIG. 1B is a cross-sectional view of the structured phosphor device of FIG. 1A according to the embodiment of the present disclosure.

FIG. 1B is a cross-sectional view of the structured phosphor device of FIG. 1A according to the embodiment of the present disclosure. As shown, the structured phosphor device 100 are depicted as an array of phosphor pixels 140 respectively formed in multiple window regions of a window frame member 130. Each phosphor pixel 140 is one unit of the structured phosphor devices filled in a window region 131 separated by a wall region 132 from any neighboring phosphor pixels 140. On a first surface of the multiple phosphor pixels 140, an antireflective coating 150 is disposed to allow that both the excitation light (i.e., incident laser beam 101) and the emitted light beam 102 are minimally reflected from the first surface of each phosphor pixel 140. Optionally, the first surface is a top surface of the phosphor in the associated device package. Optionally, the antireflective coating 150 is replaced by a surface layer treated by roughening process on the first surface of each phosphor pixel 140. Optionally, a combination of antireflective coating and surface roughening is applied to the first surface of each phosphor pixel 140. On a second surface of the multiple phosphor pixels 140, a highly reflective layer 120 is inserted before the multiple phosphor pixels 140 as well as the window frame member 130 are mounted on a substrate 110. Optionally, the second surface is a bottom surface of the phosphor in the associated device package. The highly reflective layer 120 is configured to substantially reflect mainly the light with wavelengths in a same spectra of incident light beam 101 (primarily blue color) and the re-emitted light beam 102 (substantially in white color). The substrate 110 is a highly thermally conductive material designed for efficiently transferring heat in the structured phosphor devices induced by absorption of the incident laser light beam 101 and excitation for reemitting the light beam 102. Optionally, a mounting thermal pad 160 is added between a bottom of the substrate 110 and any top surface of a dynamic lighting system that is designed to support the structured phosphor device 100 containing the array of phosphor pixels.

Figure 2:
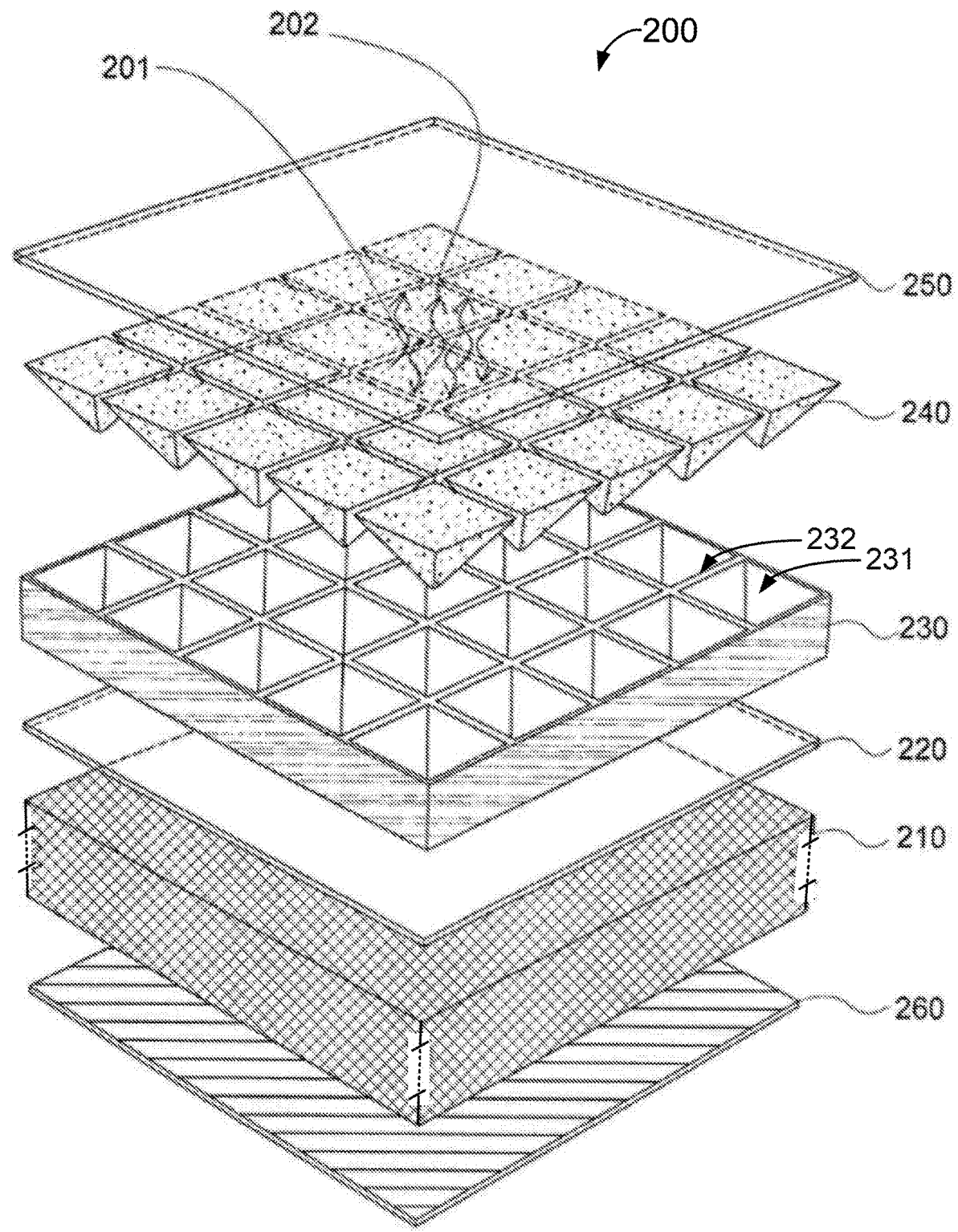
FIG. 2 is an exploded view of a structured phosphor device under a reflective-mode for a white light emission system architecture with the sloping walls of window frames according to another embodiment of the present disclosure.

FIG. 2 is an exploded view of structured phosphor devices under a reflective-mode for a white light emission system architecture with the sloping walls of window frames according to another embodiment of the present disclosure. Referring to FIG. 2, another version of the structured phosphor device 200 with an array of phosphor pixels 240 in reflective mode is depicted. Compared with the structured phosphor device 100 shown in FIG. 1A and FIG. 1B, each phosphor pixel 240 of the structured phosphor device 200 is configured to fit in a window frame member 230 with sloping walls 232 in each window region 231, as opposed to the perpendicular walls 132 in each window region 131 of window frame member 130 used in FIGS. 1A and 1B. As a result of the slopping walls, each phosphor pixel, in one embodiment, appears in an up-down pyramid shape. Of course, each phosphor pixel may be formed in several alternate shapes with multiple slopping walls depending on the frame member configuration. Otherwise, the structure in FIG. 2 is similar to structured phosphor devices shown in the FIGS. 1A and 1B. An antireflective coating 250 is placed on a first surface of all phosphor pixels 240 and the window frame member 230. Optionally, the antireflective coating 250 is replaced by a surface layer treated by a roughening treatment on the first surface of all phosphor pixels 240. Optionally, a combination of anti-reflective coating and surface roughening is applied to the first surface of all phosphor pixels 240. A reflective layer 220 is inserted between a second surface of all phosphor pixels 240 and a top surface of a substrate 210. The substrate 210 is a highly thermally conductive material and is configured to mount via a bonding layer 260 on a supporting member of a dynamic lighting system for color image displays. The window frame member 230 with slopping walls can be made by patterning and wet etching. More details about the method will be found throughout the specification and particularly below.

Figure 3A:
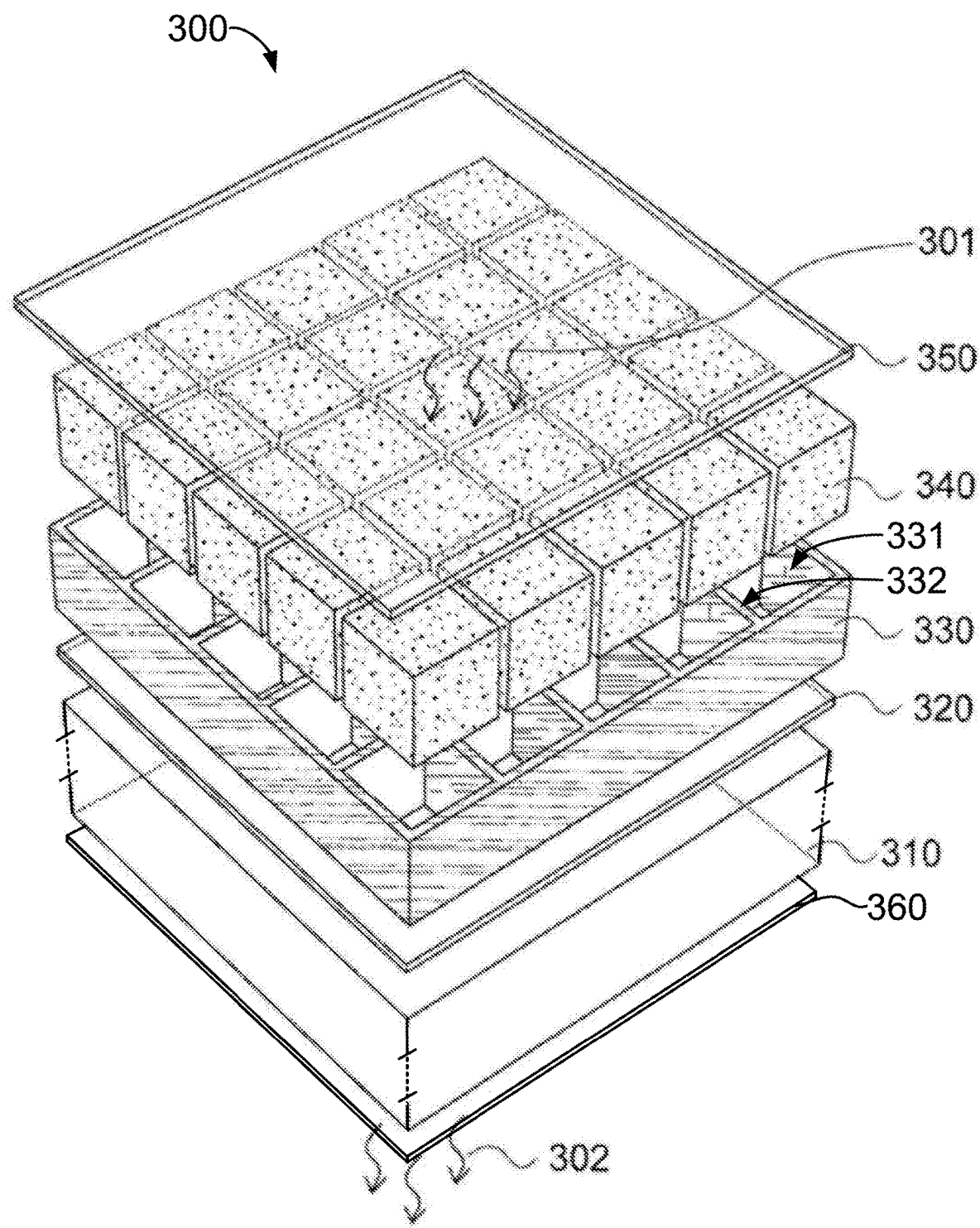
FIG. 3A is an exploded view of a structured phosphor device operated under a transmissive-mode with perpendicular walls of window frames according to yet another embodiment of the present disclosure.

FIG. 3A is an exploded view of a structured phosphor device operated under a transmissive mode with perpendicular walls of window frames according to yet another embodiment of the present disclosure. Referring to FIG. 3A, a transmissive structured phosphor device 300 is a device with multilayer structure in a multi-unit configuration fabricated on a substrate 310. Optionally, the multi-unit configuration is realized via a window frame member 330 including multiple window regions 331 separated by a wall region 332. Each of the multiple window regions 331 is filled with a phosphor material forming a phosphor pixel 340. Optionally, the multi-unit configuration is realized by dividing a single plate of phosphor material into array of units. Each unit is a phosphor pixel 340 separated by thin walls 332 of optically reflective and thermally conductive material from other neighboring phosphor pixels.

Referring to FIG. 3A, the structured phosphor device 300 containing array of phosphor pixels 340 is intended for an application to have a top surface of each phosphor pixel 340 to be independently exposed to an incident laser beam 301 originated from a laser source (not shown in FIG. 3A). The incident laser beam 301 excites each phosphor pixel 340 to generate a light beam 302 with emission spectra having longer wavelengths than the excitation wavelengths of the incident laser beam 101. Optionally, as shown in FIG. 1A, the structured phosphor device 300 is operated in transmissive mode such that the emitted light beam 302 is out of a second surface of the phosphor pixel 340. Therefore, the substrate 310 must be made by material that is optically transparent as well as highly thermally conductive. The emitted light beam 302 eventually is outputted from the bottom of the substrate 310.

Optionally, the multi-unit configuration of the window frame member 330 is formed with an array of uniformly sized window regions 332 that allows the phosphor material filled therein to form an array of phosphor pixels 340. Each phosphor pixel 340 is capable of independently generating the emitted light beam 302. Collectively, the emitted light beams from the array of phosphor pixels 340 are used to display an image with increased and controllable resolution for many dynamic display applications. In a specific embodiment, the window frame members 330 are substantially served as boundaries of phosphor pixels 340 with a minimum volume compared with the volume of the phosphor material. In other words, the wall region 332 of the window frame member 330 is made to be substantially thinner relative to the window regions 331. Alternatively, each phosphor pixel 340 is formed by dividing a single plate of phosphor material with a thin gap/trench that is filled by a wall material selected from highly thermally conductive and optically reflective material. Optionally, an optical reflective coating can be applied first to the trench wall before filling the conductive wall material. Again, the wall thickness is minimized for maximizing the phosphor pixels 340 in occupancy volume of the pixelated phosphor device 300.

In another embodiment, the size of each phosphor pixel 340 is defined primarily by etching processes that form the window regions 331 of window frame member 330 or a patterning process that directly divides a single plate of phosphor material. Optionally, the size of each phosphor pixel 340 can be as small as 5-10 μm or so depending on applications. The size of the whole array of phosphor pixels is optionally dependent on the fabrication methodology for forming the frame member 330. Optionally, the size of the array of phosphor pixels 340 can vary from few numbers of pixels for low-resolution display application to a full high-resolution array (such as 1024×1920) for high-resolution full-color display applications. For example, a typical array of pixelated phosphor devices can be an array of 100×100 pixels with a square shape pixel size of 100 μm×100 μm separated by a wall of about 5 μm or greater and a thickness in a range of 100 to 200 μm that depends on absorption coefficient of phosphor material at the excitation wavelengths. Optionally, the pixelated phosphor devices can be formed in other shapes, e.g., rectangular shape, multi-sides polygon shape, circular shape, oval shape, etc., with respective ways to measure its size according to its shape.

In a specific embodiment, a normally antireflective coating 350 is disposed on a first surface of the array of phosphor pixels 340 and wall regions 331 of the window frame member 330. The antireflective coating 350 is composed of a single film. Optionally, the antireflective coating 350 is made of a multilayer film including non-absorbing materials with alternating high and low refractive indices. For example, the antireflective coating 350 is made by alternating layers of silicon dioxide and titanium pentoxide. Optionally, the antireflective coating 350 is replaced by a surface layer with roughening treatment on the first surface of the array of phosphor pixels 340. Optionally, a combination of anti-reflective coating and surface roughening is applied to the first surface of the array of phosphor pixels 340. In another specific embodiment, an optical transparent layer 320 with optional anti-reflective coating is placed on top surface of the substrate 310. A mounting pad 360 disposed at the bottom surface of the substrate 310 is also made by optical transparent material such as optically transparent thermally conductive material for mounting the substrate 310 on to a projector device of a dynamic lighting system for receiving the emitting light beam 302 from each phosphor pixel 340 for various dynamic display applications.

Figure 3B:
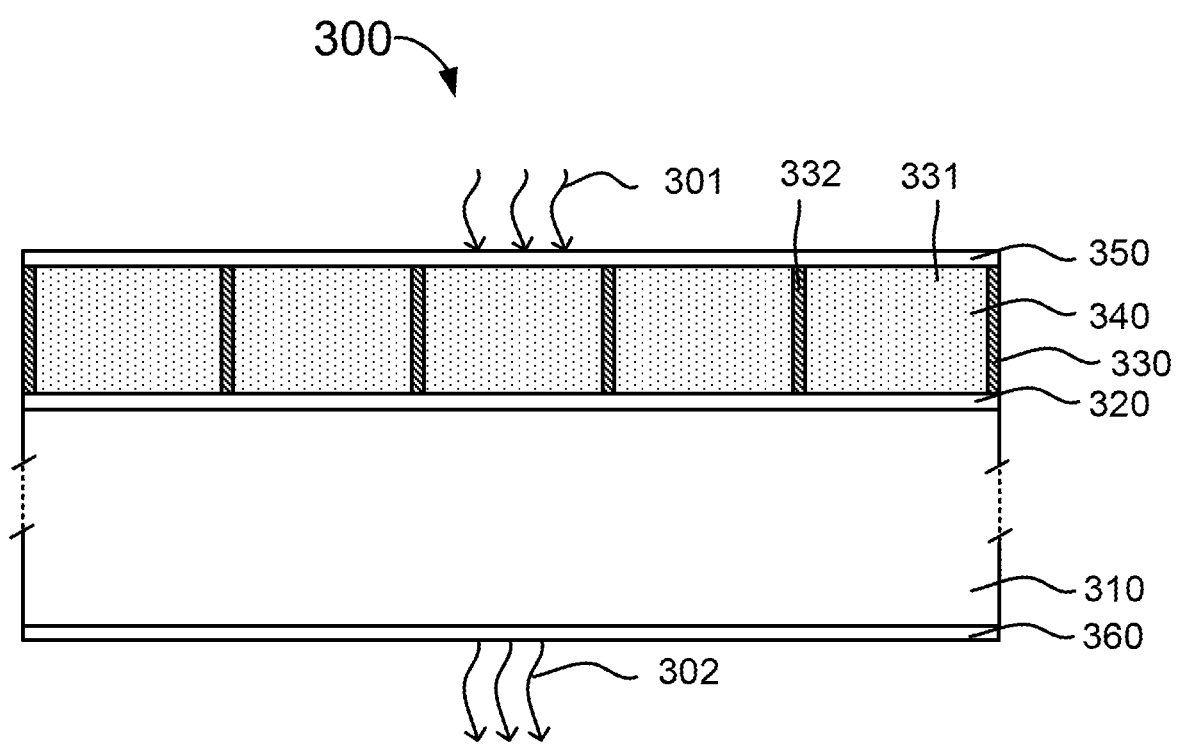
FIG. 3B is a cross-sectional view of the structured phosphor device of FIG. 3A according to the embodiment of the present disclosure.

FIG. 3B is a cross-sectional view of the structured phosphor device of FIG. 3A according to the embodiment of the present disclosure. As shown, the transmissive structured phosphor device 300 is depicted as multiple phosphor pixels 340 respectively formed in multiple window regions 331 of a window frame member 330. Each phosphor pixel 340 is one pixel of phosphor material filled in a window region (or opening in the frame member) 331 separated by a wall region 332 from any neighboring phosphor pixels 340. On a first surface of the multiple phosphor pixels 340, an antireflective coating 350 is disposed to allow the incident laser beam 301 to be minimally (less than 1%) reflected from the first surface of each phosphor pixel 340. Optionally, the antireflective coating 350 is replaced by a surface layer modified by a roughening treatment on the first surface of the array of phosphor pixels 340. Optionally, a combination of anti-reflective coating and surface roughening is applied to the first surface of the array of phosphor pixels 340. On a second surface of the multiple phosphor pixels 340, a bonding layer 320 is inserted for mounting the multiple phosphor pixels 340 as well as the window frame member 330 on a substrate 310. The bonding layer 320 is selected with a material that is optically transparent (or anti-reflective) to the emission spectra (of light beam 302) of the phosphor material 340 to allow majority of phosphor-emitted light to pass through. The bonding layer 320 yet is a strongly reflective material for rejecting >99% original excitation wavelengths (of light beam 301). The substrate 310 is a highly thermally conductive material designed for efficiently transferring heat in the structured phosphor devices induced by absorption of the incident laser light beam 101 and excitation for reemitting the light beam 102. The substrate 310 also must be optically transparent for the transmissive structured phosphor device 300 to allow the emitted light beam 302 to pass through with minimum loss. Optionally, a mounting thermal pad 360 is added between a bottom surface of the substrate 310 and a projector device (not shown in FIG. 3B) of a dynamic lighting system that is designed to receive the emitted light for display applications.

Figure 4A:
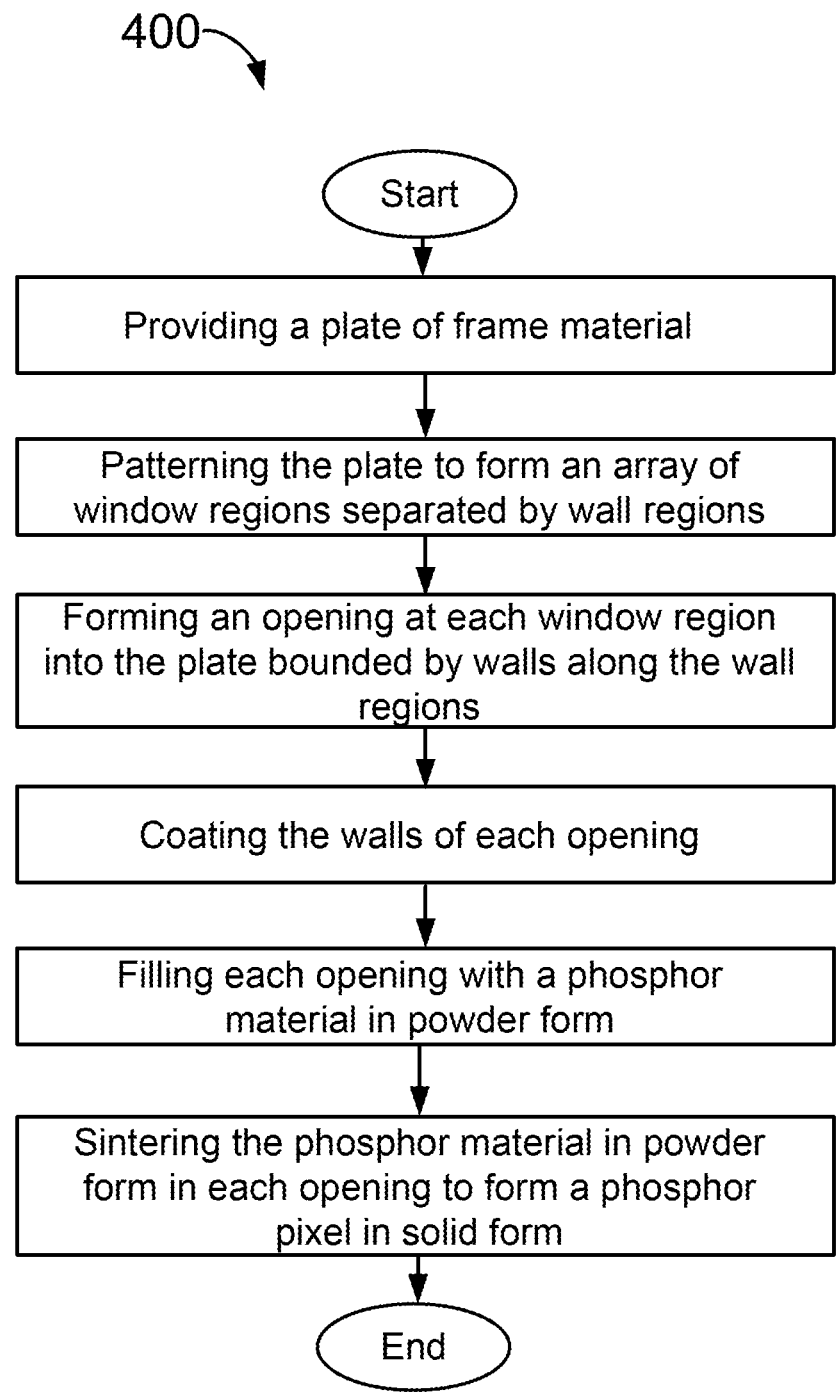
FIG. 4A is an outline of a method for fabricating a structured phosphor device with additive processing options according to an embodiment of the present disclosure.
Figure 4B:
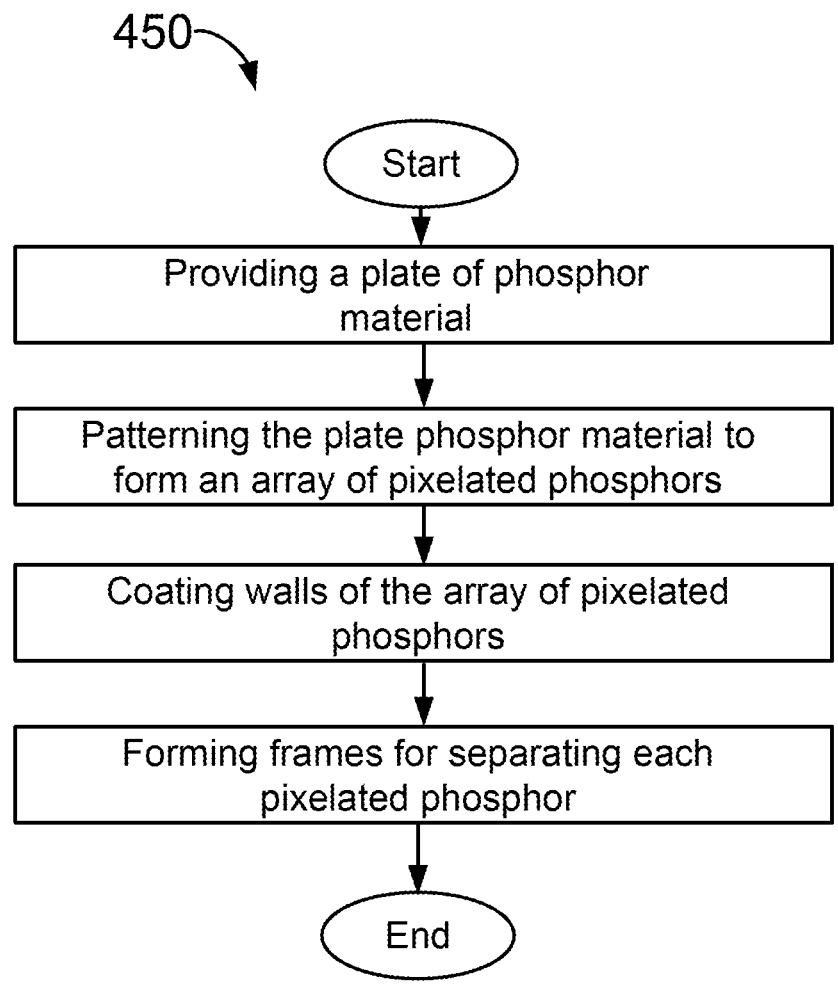
FIG. 4B is an outline of a method for fabricating a structured phosphor device with subtractive processing options according to another embodiment of the present invention.

In another aspect, the present disclosure provides methods of fabricating a structured phosphor device. The fabrications of a reflective structured phosphor device and a transmissive structured phosphor device have lots of similarities and will be outlined below for the reflective mode only. In an embodiment, FIG. 4A is an outline of an additive method for fabricating a structured phosphor device with additive processing options. In another embodiment, FIG. 4B is an outline of a subtractive method for fabricating a structured phosphor device with subtractive processing options.

Referring to FIG. 4A, the additive method 400 of fabricating the structured phosphor device starts by providing a plate of frame material. Optionally, the plate of frame material is selected from a highly thermally conductive material. Optionally, the plate of frame material is also an optically reflective material for wavelengths of both incident light beam for exciting a phosphor material associated with the structured phosphor devices and output light beam to be emitted from the excited phosphor material. Optionally, the process of providing the plate of frame material includes mounting the plate of frame material via a bonding layer onto a substrate. Optionally, the bonding layer is a material with optical reflective characteristics which provides substantially full reflection to the light beams with wavelengths of incident light and any re-emitted light from the phosphor material. Optionally, the substrate is selected from a material that is highly thermally conductive and optionally highly optically reflective for facilitating dissipation of heat in the phosphor material due to absorption of excitation light as well as for raising efficiency for generating the emitted light and guiding (reflecting) the emitted light to a projector device of a dynamic lighting system using the structured phosphor device.

Additionally, the additive method 400 includes patterning the plate of frame material to form an array of window regions separated by wall regions (as boundary of the window regions). Optionally, the frame material in each window region is removed to form an opening or trench with a high height/width aspect ratio into the plate of frame material with walls of frame material long the wall regions. Optionally, the walls are in a substantially perpendicular angle relative to the surface of the plate of frame material. Optionally, the opening is formed from a first (or top) surface of the plate of frame material to a second (or bottom) surface till the bonding layer is exposed. Optionally, the walls are configured to be minimized in thickness relative to the space of opening. Optionally, the window regions are patterned with uniform size and shape to simplify the manufacture process, although the size and shape can vary, in particular when the patterning is performed by photolithographic or direct photo writing methods. Optionally, the opening is made with a lateral size ranging from as small as 5 or 10 µm to 100 µm or greater through total thickness of the plate of frame material in a range of 100 to 200 µm for making functional phosphor pixel therein depending on absorption coefficient of phosphor material at the excitation wavelengths. Optionally, the opening is made with sloped walls with a relatively larger size on the first surface and reduced sizes into the plate of frame material, making the opening substantially in an up-down multi-side pyramid shape. At a bottom of the opening where at least some sloped walls may join, the bonding layer may or may not be exposed. Optionally, the opening can be formed in many other shapes, e.g., rectangular shape, multi-sides polygon shape, circular shape, oval shape, etc., with respective ways to measure its size according to its shape. The shape of each opening determines the shape of a phosphor pixel formed therein. In an example, a structured phosphor device with small phosphor pixel size of less than 10 µm bounded by a wall thickness down to 5 µm is made into a full array of 1024×1920 phosphor pixels for high-resolution full-color display applications. Practically, a structured phosphor device with larger phosphor pixel sizes can be made much less costly and still very useful for many low-resolution display applications.

Referring to FIG. 4A, the method 400 further includes coating the walls of the openings with an optically reflecting film. The wall of the opening is part of the frame material which is made by materials that may not have sufficient optical reflectivity. Optionally, the optically reflecting film applied to the walls is a metalized material that is intended for providing high reflectivity to the excitation light beam and the emitted light beam of the phosphor material to be filled in the array of window regions. The optically reflecting film also prevents the light cross-talking between neighboring pixels. With the coating being applied, the plate of frame material is thus transformed to be a window frame member with array of window regions configured for holding a phosphor material.

Furthermore, the method 400 includes filling each opening with a phosphor material. Optionally, the phosphor material is disposed in powder form with particle sizes in nanometer range to fill each opening of the frame member. Optionally, the phosphor material is disposed with in powder form with particle sizes in micro-meter range to fill each opening of the frame member. Depending on applications, micro-powder phosphor material with larger particle size is chosen over the nano-powder phosphor material with finer particle size for filling larger sized openings to form larger phosphor pixels at lower process cost. Optionally, the phosphor material is disposed with a powdered phosphor material mixed with an inorganic binder material to fill the array of openings. The inorganic binder material is used to facilitate a lower temperature sintering process to be performed next. Such inorganic material can enhance the scattering of excitation light in the phosphor-binder material which leads to shorter effective absorption distances and thinner phosphor material layers.

Referring to FIG. 4A as the additive process option, the method 400 includes sintering the phosphor material in powder form filled in the array of openings of the frame member to turn the powdered phosphor material into hardened phosphor material in a solid form. As a result, an array of phosphor pixels of the structured phosphor device is formed with the sintered (solid) phosphor material in each opening as a phosphor pixel. Depending on the types, particle sizes, size combinations of the powdered phosphor material as well as whether an inorganic binder material is added therein, the sintering process can be varied in choice of thermal stages design, temperatures and rates of change for each stage, pressures applied in each stage, or other conditions set for each stage. More details of the additive process are described in the specification below.

Referring to FIG. 4B, the method 450 of fabricating the subtractive structured phosphor device starts by providing a plate of phosphor material. Optionally, the plate of phosphor material is selected from a single-crystal or poly-crystal material. Optionally, the process of providing the plate of phosphor material includes mounting (a bottom surface of) the plate of phosphor material via a bonding layer onto (a top surface of) a substrate. Optionally, the bonding layer is a material with optical reflective characteristics which provides substantially full reflection to the light beams with wavelengths of incident light and any re-emitted light from the phosphor material. Optionally, the substrate is selected from a material that is highly thermally conductive and optionally highly optically reflective for facilitating dissipation of heat in the phosphor material due to absorption of excitation light as well as for raising efficiency for generating the emitted light and guiding (by reflection) the emitted light to a projector device of a dynamic lighting system using the structured phosphor devices.

Additionally, the method 450 includes patterning the plate of phosphor material to form an array of pixelated phosphors or phosphor pixels. The process of patterning includes certain masking, dry or wet etching, and lifting off steps to form a cross-network of narrow-deep trenches that define the array of phosphor pixels. Optionally, the cross-network of narrow-deep trenches can also be formed by directly dicing through the plate of phosphor material. Optionally, the process of patterning includes photo writing or photo exposing some regions along the narrow-deep trenches to alter chemical bonding in the crystallized phosphor material before performing chemical etching to remove the altered phosphor material in the narrow-deep trenches. Optionally, the array of phosphor pixels is substantially uniformly sized in length and width per pixel and uniformly shaped, although it is not required. Optionally, the size of the whole array of phosphor pixels, i.e., the size of the structured or pixelated phosphor device, is dependent upon available size of a single plate of phosphor material. The thickness of the plate of phosphor material limits the depth of each phosphor pixel. Optionally, the depth of the narrow-deep trench reaches the bottom surface of the plate of phosphor material to expose partially the bonding layer attached to the bottom surface of the plate of phosphor material and the top surface of the substrate. The size in length and width and the depth of each phosphor pixel also defines its side wall. Optionally, the patterning process can be designed to form the phosphor pixels in many other shapes, e.g., rectangular shape, multi-sides polygon shape, circular shape, oval shape, etc., with respective ways to measure its size according to its shape.

Referring to FIG. 4B, the subtractive method 450 further includes coating walls of the array of phosphor pixels. Unlike the additive method 400 where the walls of each window region of the window frame member formed therein are coated, in the subtractive method 450, walls of each phosphor pixel are coated with a metalized material for providing high reflective characteristics to prevent the light cross-talking between neighboring pixels.

Furthermore, the subtractive method 450 includes forming frames for separating each phosphor pixel from its neighbors. Optionally, a frame material with high thermal conductivity is selected to be deposited into the narrow-deep trenches (after the metalized coating is placed). Electroplating is an optional technique for performing the deposition. Optionally, around outer boundaries of the structured phosphor device a wall of the frame material is formed to add an outer frame wall for each phosphor pixel located at the outer boundaries.

Figure 5A:
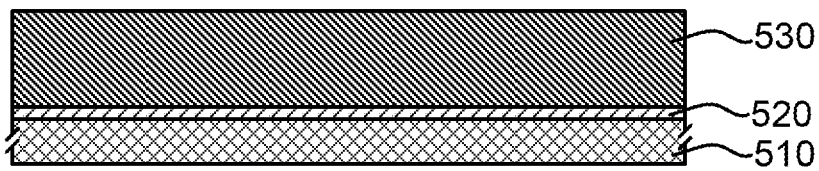
FIGS. 5A through 5F are schematic diagrams for illustrating a fabrication method with additive processes for forming an array of pixelated phosphor devices according to some embodiments of the present disclosure.

FIGS. 5A through 5F are schematic diagrams for illustrating a fabrication method with additive processes for forming a structured phosphor device containing an array of phosphor pixels according to some embodiments of the present disclosure. In some embodiments, the additive fabrication method 400 described in FIG. 4A is shown in more details by FIGS. 5A-5F. Referring to FIG. 5A, the method of fabricating the structured phosphor device starts with attachment of a plate of frame material 530 to a substrate 510 via a bonding layer 520. The plate of frame material 530 is provided for being patterned into the window frame member 130 as shown in FIG. 1A. Optionally, the plate of frame material can be a silicon material. Optionally, the plate of frame material 530 is metalized with a highly reflective film for both excitation light (e.g. blue light from a GaN-based laser source) and phosphor emitted light (e.g. white or color light with wavelengths longer than the excitation light). The metalized film of the plate 530 is also turned to be a good thermal conductor. Optionally, the metalized film is made by tungsten, molybdenum, or other high-melting-point metal materials. The metalized plate 530 is attached to the substrate 510 as indicated in FIG. 5A. Optionally, the bonding layer 520 between a bottom surface of the metalized plate 530 and a top surface of the substrate 510 is also an optically reflective layer for both excitation light and phosphor emitted light.

Figure 5B:
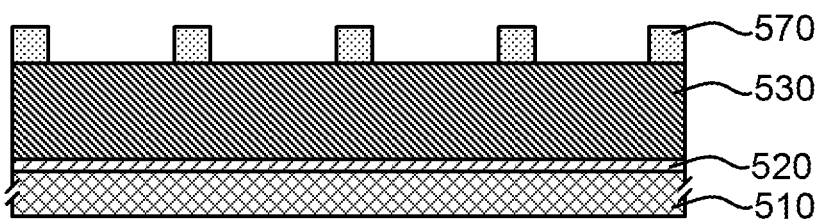
Figure 5C:
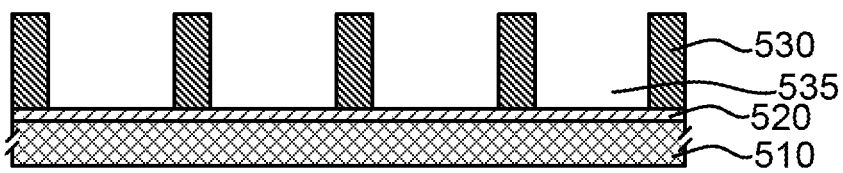

In another step of the additive fabrication method 400 shown in FIG. 5B, a hard mask layer 570 is formed on a surface of the plate 530. Optionally, a deep reactive etching process of the frame material (e.g. of silicon) can be performed to form multiple window regions 535 with perpendicular walls through a whole thickness of the plate of frame material 530. Each window region 535 in the plate of frame material 530 forms a pixel well with vertical walls. Optionally, a wet etching process is performed to form each window region with slope walls in each side in to the plate of frame material 530. In this case, the pixel well has a reversed pyramid shape. Following the etching process, the additive fabrication method 400 includes a step of stripping the hard mask layer 570 as shown in FIG. 5C.

Figure 5D:
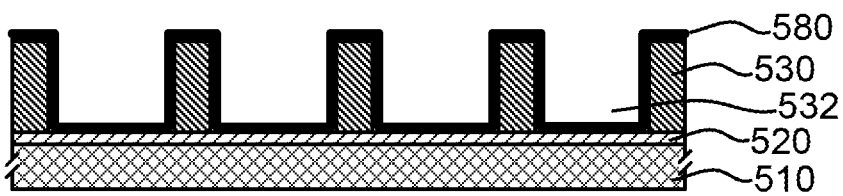

Optionally, the additive fabrication method 400 includes a step of coating a highly reflecting film 580 overlying all side walls and bottom surfaces inside the pixel wells formed at the window regions 535 after the hard mask layer 570 is stripped. This step is depicted in FIG. 5D. Optionally, the reflecting film 580 is designated for efficiently reflecting both excitation light from the laser source and emitted light from the phosphor material to be added in the pixel wells at the window regions 535.

Figure 5E:
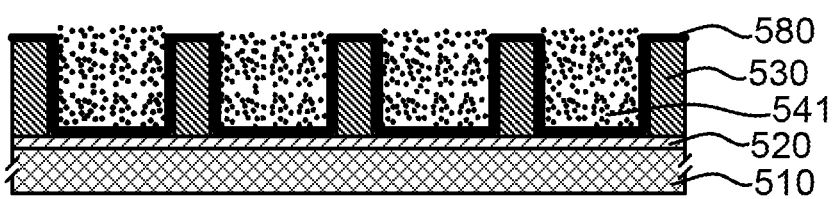
Figure 5F:
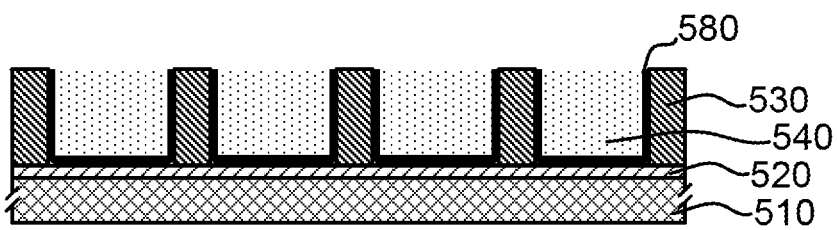

The additive method 400 of fabricating pixelated phosphor devices further includes a process, as shown in FIG. 5E, of filling of pixel wells with phosphor material 541. In an embodiment, the phosphor material 541 in powder form includes nano-crystalline powders or micro-crystalline phosphor powders or mixture of phosphor powders with one or more inorganic binder materials that have much lower melting temperature than the bulk crystalline/poly-crystalline phosphor itself. When the nano-crystalline powders or micro-crystalline phosphor powders are used, the melting or sintering temperature of the powders can be lowered significantly below the melting temperature of bulk crystalline phosphor material. For example, the melting temperature for YAG phosphor materials is around 1950° C. Adding inorganic binder material also facilitates the next step of sintering the phosphor powder material 541 into solid bulk (not fully crystallized) phosphor material 540, as shown in FIG. 5F. The plate of frame material 530 and its metalized film as well as the reflecting film 580 coated later on the side walls and bottom surfaces of the pixel wells, and top ridges of the of wall regions around each pixel wells that provides the support and pattern for the phosphor powders must survive the sintering temperatures. By properly selecting the powder particle sizes of the nano-crystalline or micro-crystalline phosphor material, it is possible to make the sintering temperatures substantially lower than the bulk melting temperature of the phosphor material. In an example, a nominal particle size of nano-crystalline phosphor powder is approximately below 5 nm and correspondingly the sintering temperature used in the sintering process (FIG. 5F) can be reduced to a range of about 600° C. Optionally, the filling of phosphor powders in the pixel wells can be done by means of printing or ink dripping/drying and the sintering of the phosphor material in powder form can be programmed with multi-stages of heating and cooling with different temperatures, pressures, and process times. There can be many variations, modifications, and alternatives.

In an alternative embodiment, the process of turning the phosphor powder 541 into bulk phosphor 540 at lower than bulk melting temperature is to employ laser sintering. The phosphor powders in each pixel well to be sintered may be exposed to high temperatures only from very short pulses of laser light and absorb heat within a local region around the laser spot so that the surrounding structures (wall region of the window frame member 530 and the coating 580, substrate 510, and reflecting films 520) are not damaged or distorted. In such a case, the substrate 510, window frame member 530 and reflecting films 520 can use materials with relative low melting temperatures such as silicon, copper, aluminum and others with much lower cost in easier processes.

Optionally, the additive fabrication method 400 for forming a structured phosphor device containing an array of phosphor pixels may include polishing of the surface of sintered phosphor 540 by a chemical-mechanical process so that the surfaces of the phosphor pixels become smoother and do not cause excessive light scattering. Optionally, the additive fabrication method 400 further includes coating an anti-reflective film (e.g., anti-reflective film 150 in FIG. 1B or anti-reflective film 250 in FIG. 2) to allow >99% excitation light and at least majority of emitted light to pass through the surface of the sintered phosphor to enhance conversion efficiency of the pixelated phosphors.

FIGS. 6A through 6I are schematic diagrams for illustrating a fabrication method with subtractive processes for forming a structured phosphor device having an array of pixelated phosphors according to some embodiments of the present disclosure. In some embodiments, the subtractive fabrication method 450 described in FIG. 4B is shown in more details by FIGS. 6A-6I. The subtractive fabrication method is particularly useful for implementing the formation of array of pixelated phosphors using a single-crystal phosphor plate that has better thermal performance than polycrystalline phosphor materials or mixed materials of phosphor powder and inorganic binder.

Figure 6A:
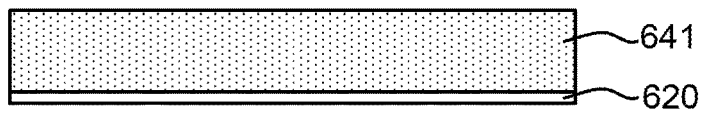
FIGS. 6A through 6I are schematic diagrams for illustrating a fabrication method with subtractive processes for forming an array of pixelated phosphor devices according to some embodiments of the present disclosure.
Figure 6B:
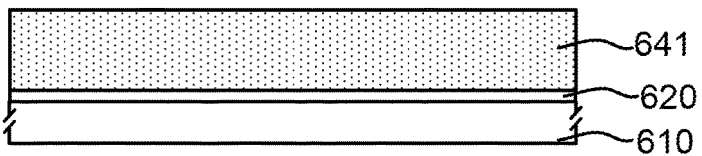

Referring to FIG. 6A, the method 450 for fabricating an array of pixelated phosphors includes providing a plate of single-crystal or poly-crystal phosphor material 641. Optionally, the plate of phosphor material 641 has a thickness in a range of 100 to 200 µm that depends on absorption coefficient of phosphor material at the excitation wavelengths and a lateral dimension without specific limitation. Optionally, as shown in FIG. 6A, a reflective layer 620 is coated on one side of the plate of phosphor material 641 in single-crystal or poly-crystal structure. In the embodiment, the method 450 further includes attaching the reflective layer 620 (which is coated to one side of the plate of phosphor material 641) to a highly thermally conducting substrate 610, as shown in FIG. 6B. Optionally, the substrate 610 is made of copper. In some embodiments, thermal processing limitations are not present or are minimized in the subtractive fabrication method 450 compared with the additive fabrication method 400 described in paragraphs above.

Figure 6C:
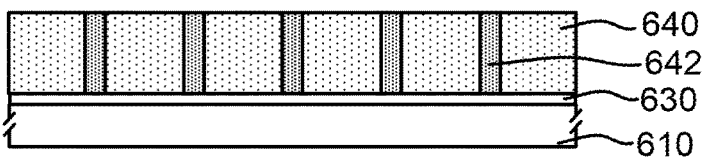

Referring to FIG. 6C, the method 450 also includes a step for patterning the plate of phosphor material 641. Optionally, the patterning involves photo writing of the single-crystal or poly-crystal phosphor material with very high power density, scanned laser beam with nano-second to femto-second pulse duration. Such a laser writing process can convert the original (single or poly) crystalline phosphor material 641 within a restricted area into an altered phosphor material that is slightly porous or amorphous or has at least broken or altered molecular bonds. Optionally, the restricted area is a predefined grid pattern as wall regions 642 dividing the original plate of phosphor material 641 into multiple unit regions 640. Optionally, the multiple unit regions 640 can be uniform in size and be configured to be an array of phosphor pixels or pixelated phosphors. Depending on applications, the size of each phosphor pixel can be fairly large to obtain a low-resolution white light emission plate of a dynamic lighting system for image display or can be made as small as 5 or 10 µm laterally for forming a full high-resolution display with an array of 1024×1920 phosphor pixels.

Figure 6D:
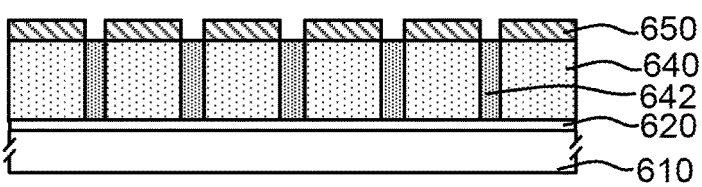

Optionally, in order to realize the formation of the multiple phosphor pixels, the method 450 first includes applying a photo-resist mask layer 650 to cover all not-to-be patterned unit regions 640, as shown in FIG. 6D. Subsequently, the patterned surface is exposed to large area beam of femto-second or picosecond pulses that alter phosphor material not protected by the mask.

Figure 6E:
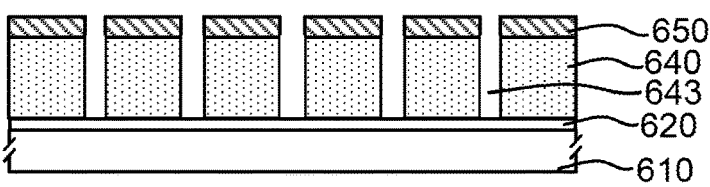

Then the wall regions 642 with the altered phosphor material can be etched in a wet etching process or in dry plasma etching process selectively because of altered molecular bonding therein, as shown in FIG. 6E. The etch process removes the altered phosphor material in the wall regions 642 to form a network of trenches 643 (only individual trenches are visible in the cross-sectional view of FIG. 6E). These trenches in phosphor plate can be subsequently filled with light reflecting and thermally conducting materials. Optionally, once the hard mask 650 was applied, directional, deep reactive ion etching can be applied to form the trenches 643 directly.

In an example, the photo writing (FIG. 6C) is performed with pulse laser using ~100 to 200 fsec pulse duration, repetition rate around 500 kHz, and pulse energies of about 0.2-10 µJ. Pump laser source based on GaN diode operates at 808 nm and emission from each phosphor pixel occurs at 1064 nm. Optionally, multiscan technique is used with linear scanning rates 4-8 mm/sec and pulse energies are selected in a range of about 200 nJ.

In an example, the etching process (FIG. 6E) of the altered phosphor material in the wall regions 642 is performed with chemical wet etching of YAG (Er:$Y_3Al_5O_{12}$) by orthophosphoric acid $H_3PO_4$ at T>100° C.

Alternatively, the photo-exposure can be done by using reflecting masks placed over the pixel regions. The repeated exposure of the surfaces with pulsed light of appropriate spectrum and power density can lead to the direct removal of the phosphor material therein to form the trenches 643.

When hard mask 650 is used (FIG. 6D), the trenches 643 are formed by etching the phosphor material from wall regions 642 that are not protected by the hard mask 650. Optionally, the trenches 643 are formed to be substantially perpendicular to the surface of the plate of crystalline or polycrystalline phosphor material 641. Optionally, the trenches 643 are made with a depth equal to a thickness of the plate of phosphor material 641. In other words, the trench 643 is a through-plate trench with a narrow width and deep depth.

In another alternative embodiment, an approach to create the trenches 643 in the plate of phosphor material 641 is by mechanical dicing performed directly along wall regions 642. Optionally, the width of trenches formed by mechanical dicing can be down to 20-50 µm. Additionally, chipping or cracking in the cross-linked trenches needs to be avoided. At least, the mechanical dicing provides a way for making relatively large phosphor pixels for low resolution display in dynamic lighting system. In contrast, the width of trenches created by photo writing and etching can be made to be smaller than 5 µm, resulting in relatively small volume loss of the phosphor material while more phosphor material retained for production of emitted light.

Figure 6F:
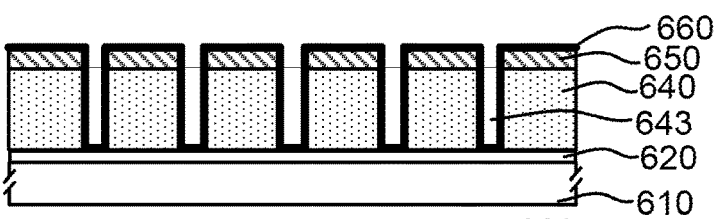

Referring to FIG. 6F, the method 450 further includes forming a metal coating 660 on side walls of the trenches 643. Optionally, the metal coating 660 is a metal alloy layer. Optionally, the metal coating 660 is a multilayer film, such as depositing an aluminum layer first followed by electroplating compatible seed layer. The metal coating 660 is designed for providing function of optical reflection for the emitted light by the phosphor material in each phosphor pixel 640.

Figure 6G:
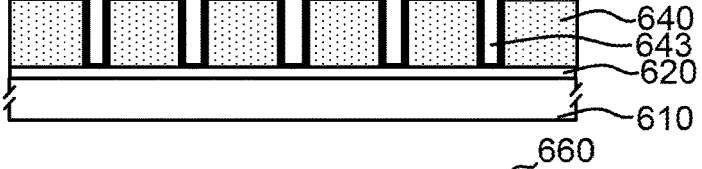
Figure 6H:
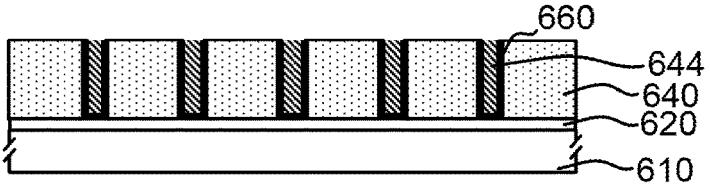
Figure 6I:
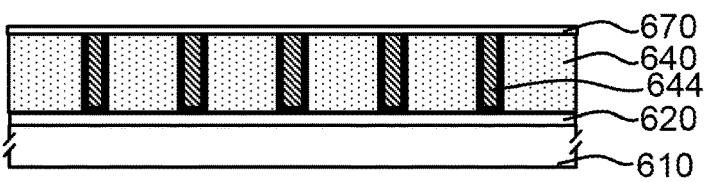

The method 450 further includes a step, shown in FIG. 6G, of stripping the protective (photo-resist) mask 650 including the portion of metal coating 660 that deposited thereon. Optionally, the stripping process is a liftoff process that leads to re-appearance of top surface of the phosphor material in each of phosphor pixels 640. At this stage, each phosphor pixel 640 is still surrounded by the trenches 643 with side walls being coated by the metal coating 660. In a next step, the method 450 includes filling the trenches 643 (with side walls being coated by metal coating 660) with highly thermally conducting materials 644 as shown in FIG. 6H. Optionally, copper is one of selected materials to fill the trenches 643 by electroplating. Now, each phosphor pixel 640 is separated by highly thermally conducting material 644 (as well as metal coating 660 placed earlier), substantially forming the array of pixelated phosphors. Optionally, a planarization process may be performed on the top surface of the whole array of pixelated phosphors by chemical mechanical polishing for smoothening the surface of phosphor pixels 640 and remove debris of conducting material 644 and metal coating 660. Optionally, the top surface can be controllably roughened to increase scattering in the phosphor and effectively increase absorption length of the excitation light. The subtractive fabrication method 450 may include a step of forming an antireflective film stack 670, shown in FIG. 6I, on the top surface of the pixelated phosphors that is just smoothened in the previous step for enhancing absorption of excitation light and generation of emission light.

In some embodiments, the method 400 and the method 450 are also applicable to fabricate transmissive pixelated phosphors (e.g., see FIGS. 3A and 3B) with substantially similar processes of fabricating reflective pixelated phosphors except that the reflective layer 520 or 620 attached with the plate of frame material 530 or the plate of phosphor material 641 should be substituted by a transmissive layer and the substrate 510 or 610 should be made by optical transparent material.

Figure 7:
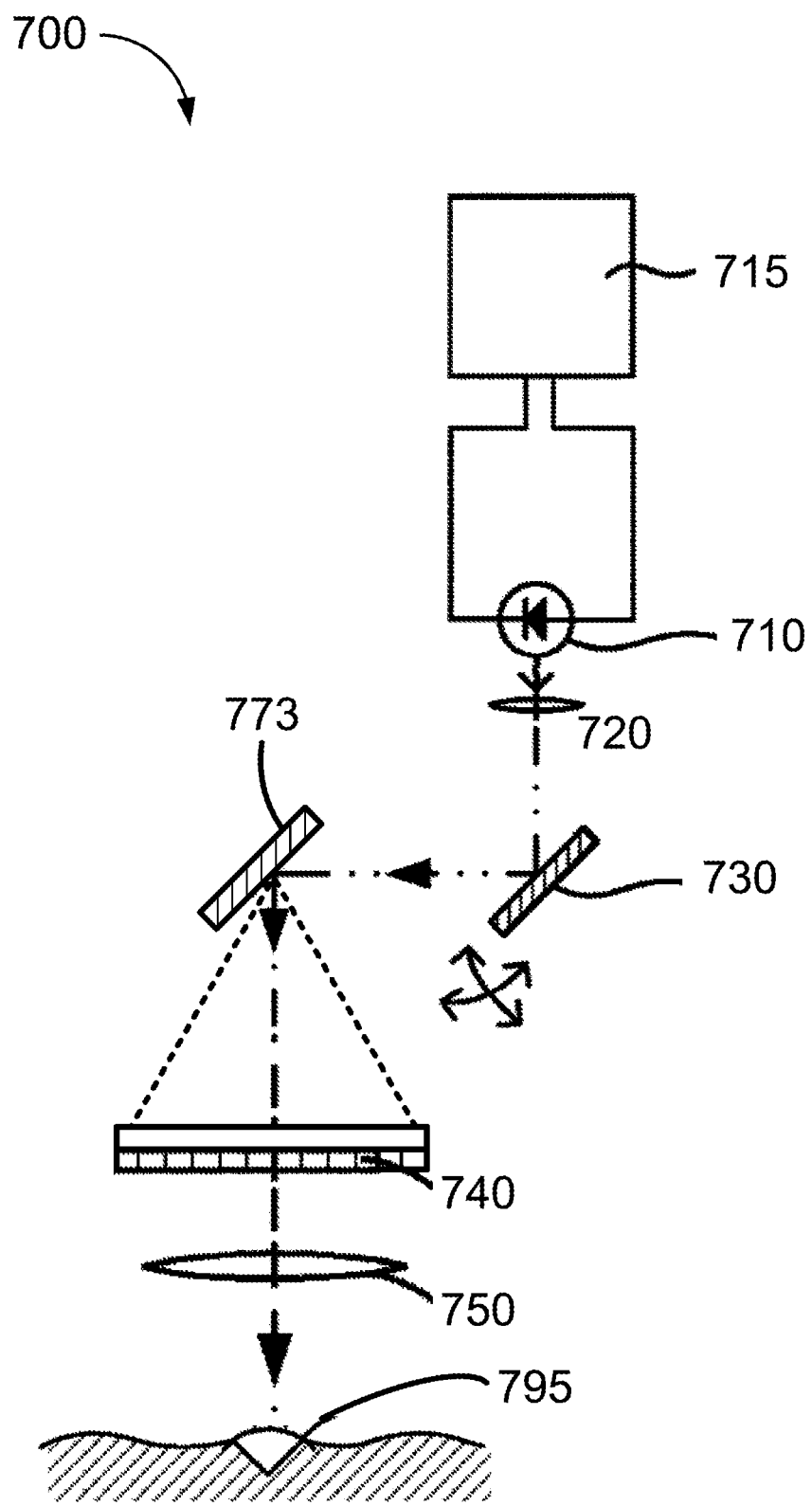
FIG. 7 is a simplified optical architecture of a single color or white-light projection display using one-color pixelated phosphors excited by a single laser source according to an embodiment of the present disclosure.

In an alternative aspect, the present disclosure provides a dynamic lighting system for projection display using a structured phosphor device. FIG. 7 shows a architecture diagram of a dynamic lighting system for one color or black and white projection display using one color pixelated phosphors excited by a single laser source according to an embodiment of the present disclosure. As shown, the dynamic lighting system 700 includes a display medium 740 which is based on a structured phosphor device containing an array of pixelated phosphors. Among the array of pixelated phosphors, there is only a single type phosphor material designed for generating one color emitted light from conversion of an incident excitation light in the phosphor pixel. Optionally, as shown in FIG. 7, the array of pixelated phosphors 740 is operated in transmissive mode (see FIGS. 3A and 3B). The one incident excitation light for the pixelated phosphors 740 is a modulated light generated by the laser diode 710 that is driven by the laser driver, video processing electronics according to input data represented by the driving control unit 715. Optionally, the laser diode 710 is a surface mounting laser device on a base coupled to a substrate for supporting the structured phosphor device for directly illuminating the laser light to the top surface of the pixelated phosphors 740. Optionally, the laser diode 710 can be disposed separately from the pixelated phosphors 740 while guiding the laser light indirectly via an optical fiber (not shown) to illuminate it onto the top surface of the pixelated phosphors 740. Optical elements including at least a lens 720 and a first mirror 730 configured as a scanning biaxial, bidirectional mirror and a second mirror 773 configured as a fixed mirror or optionally a two-state (on-off) mirror. The first mirror 730 provides scanning patterns over the entire array of pixelated phosphors 740. Typically, the second mirror 773 is fixed at an on-state to reflect the in-coming modulated light to one particular phosphor pixel of the pixelated phosphors 740. Optionally, the second mirror 773 can be an off-state so that the in-coming light is directed completely off the array of pixelated phosphors 740. This feature can be used as a safety measure when control of the laser beam or the scanning mirror fails in order to protect the observer.

The emitted light beams respectively by different phosphor pixels of the pixelated phosphors 740 are processed by an optical imaging subsystem (or simply a projection lens) 750 and directed as an image to the eye of the observer or on the screen 795. The array of pixelated phosphors 740 provides pixel-level dynamic control of emitted light intensity variation for displaying a dynamic (yet a single color or black-white) image with a resolution defined by the number of pixels, pixel sizes, and spot size of the excitation beam.

Figure 8:
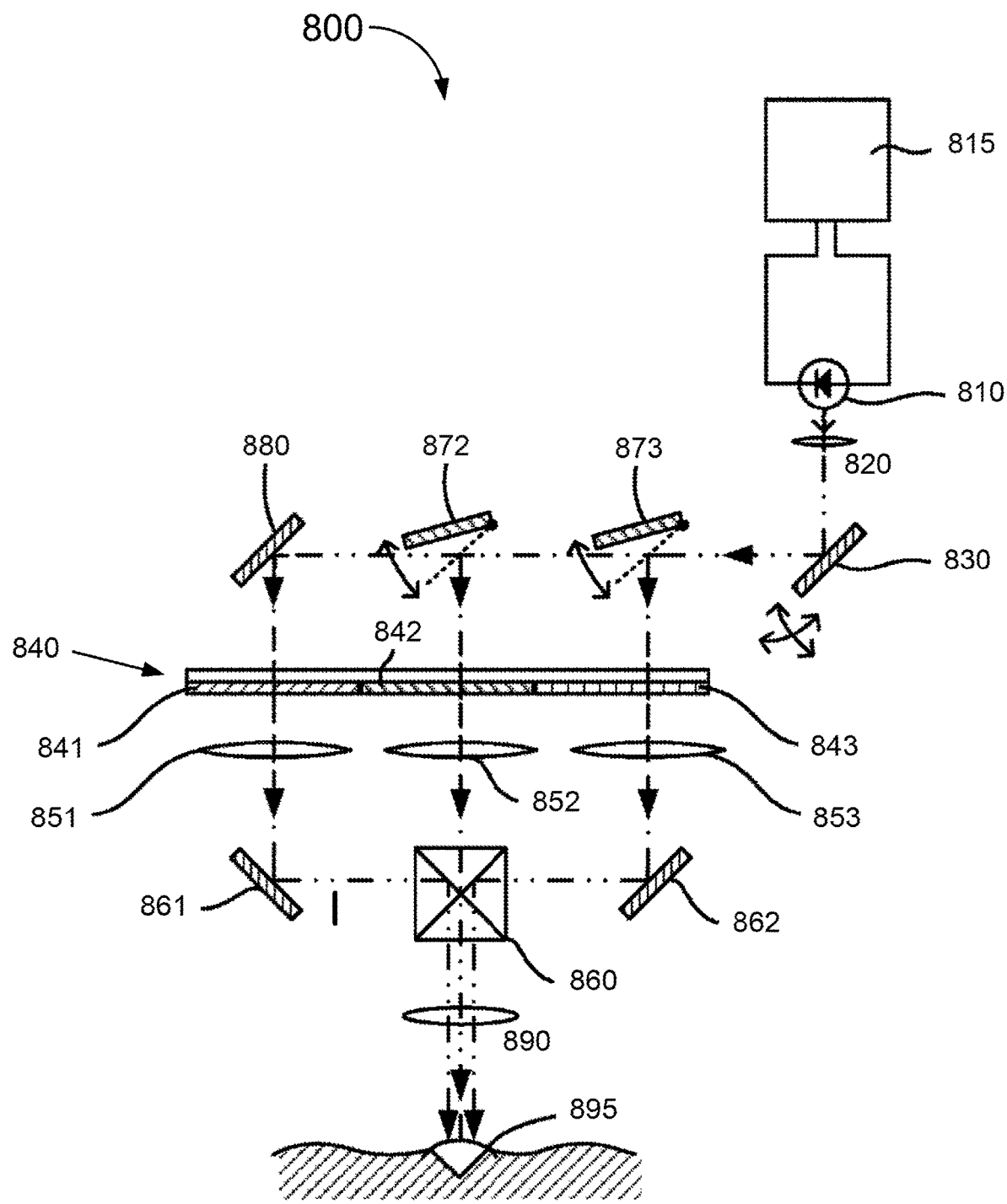
FIG. 8 is a simplified optical architecture of a full color projection display using multi-color pixelated phosphors excited by a single laser source according to another embodiment of the present disclosure.

In an alternative embodiment, a full color display architecture can be provided based on multiple color pixelated phosphors disclosed herein. FIG. 8 shows an architecture of a dynamic lighting system for a full color projection display using a combination of multiple color pixelated phosphors excited by a single laser source according to another embodiment of the present disclosure. Referring to FIG. 8, the dynamic lighting system 800 includes a display medium 840 containing a combination of three structured phosphor devices 841, 842, and 843. Each structured phosphor device is an array of pixelated phosphors having one type of phosphor material configured for emitting a specific color light converted from the excitation light. Optionally, one structured phosphor device 841 is configured to emit a light with substantial green color spectra, another one structured phosphor device 842 is configured to emit a light with substantial red color spectra, and yet another one structured phosphor device 843 is configured to emit a light with substantial blue color spectra. Optionally, as shown in FIG. 8, the three structured phosphor devices 841, 842, and 843 are arranged in a row as three large multi-pixels of the structured phosphor device 840. The one incident excitation light for the phosphors is a modulated light generated by the laser diode 810 that is driven by the laser driver, video processing electronics according to input data represented by the driving control unit 815. A biaxial, bidirectional scanning mirror 830 provides scanning patterns over three pixelated phosphors 841, 842, and 843. A two-state (on-off) mirror 873 allows the excitation light from the laser diode 810 to be guided onto the first pixelated phosphor 843 when it is in the on-state. When the mirror 873 is in the off-state and another mirror 872 is switched into on-state, the excitation light is directed onto the second pixelated phosphor 842. When both mirror 873 and mirror 872 are in the off-state, the excitation light falls onto a fixed mirror 880 that brings the light onto the third pixelated phosphor 841. Three-colored light emitted respectively by three pixelated phosphors 841, 842 and 843 is imaged by the optical subsystems 851, 852, and 853 and directed for recombination into one beam by using mirrors 861 and 862 and combining cube 860. The images are formed on the eye of the observer or on the screen 895.

Figure 9:
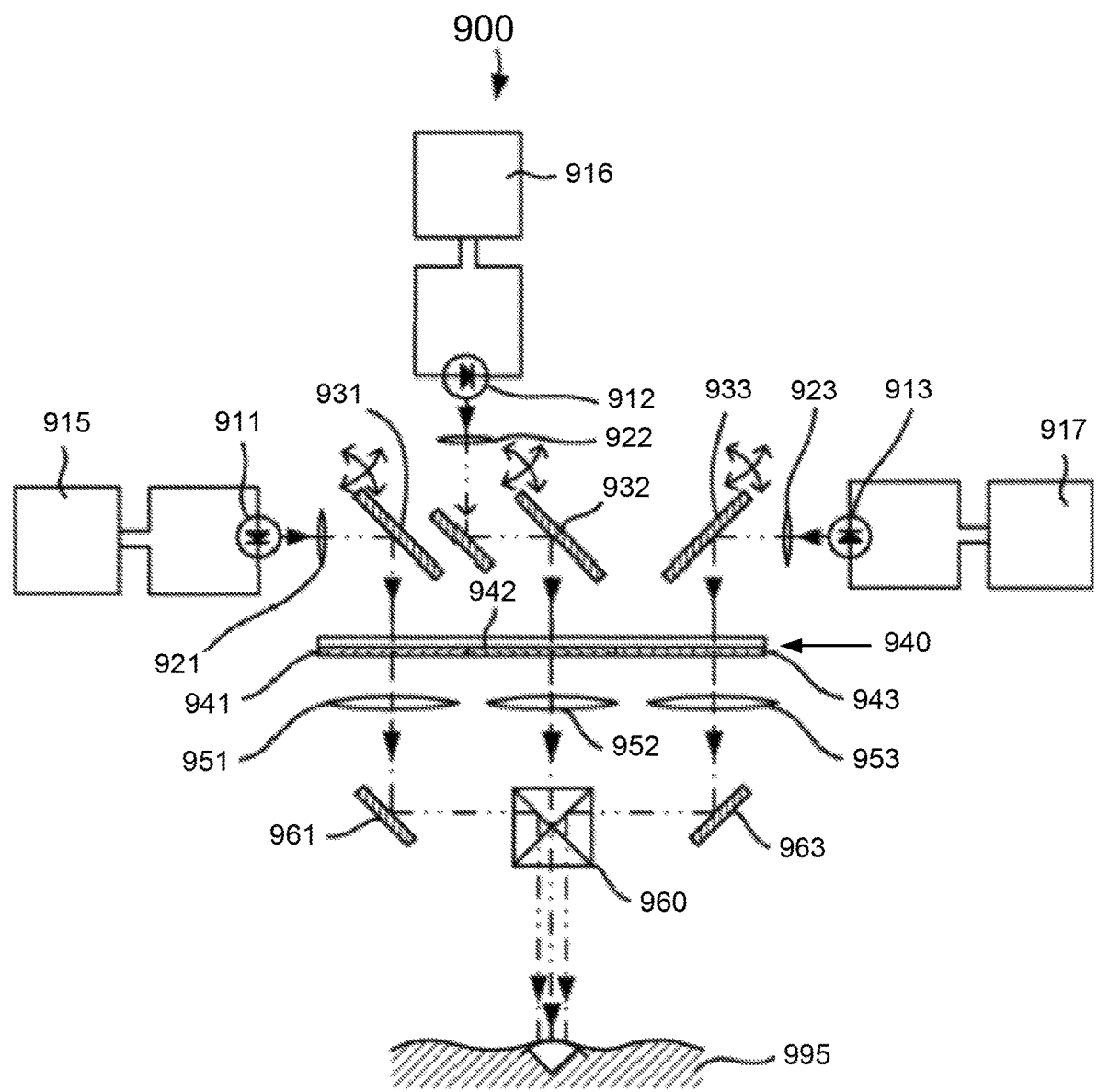
FIG. 9 is a simplified optical architecture of a full color projection display using multi-color pixelated phosphors excited by multiple laser sources according to yet another embodiment of the present disclosure.

Additional design and performance flexibility can be achieved by adding additional light sources and the scanning mirrors to the optical architectures described above. The option with additional optical elements is of particular interest when the displays or smart lighting are intended for high brightness applications that cannot be satisfied by the single light source with the highest available power. FIG. 9 is a simplified optical architecture of a full color projection display using multiple color pixelated phosphors excited by multiple laser sources according to yet another embodiment of the present disclosure. Referring to FIG. 9, the optical architecture 900 includes a display medium also made by a structured phosphor device 940 with at least three phosphor pixels 941, 942, and 943, which is substantially the same as the structured phosphor device 840 disclosed in FIG. 8. In this example, back side illumination onto the phosphor pixel is selected for one typical architecture, even though reflection or front side illumination can be used. When higher display brightness than brightness that can be provided with the highest single laser power output and phosphor combination is needed, additional laser diodes may be needed. In this embodiment, three laser diodes 911, 912, and 913 with ultraviolet or blue wavelength may serve as excitation light sources. These laser diodes are driven with electronic circuits 915, 916, and 917. The laser light from each of the laser diodes 911, 912, and 913 is collimated with optical elements 921, 922, and 923 respectively. The collimated, modulated light trains are directed to three biaxial, bidirectional scanning mirrors 931, 932, and 933 that respectively address the corresponding three color pixelated phosphors 941, 942, and 943. This type of addressing is referred to herein as simultaneous color addressing. he data rates to modulate the laser diodes 911, 912, and 913 can be at least three times slower than color sequential addressing data rates disclosed in FIG. 8. Moreover, the scanning mirror resonant frequencies for the fast axis can be three times lower than the frequencies required for sequential color addressing of FIG. 8. Three color light beams emitted from the three pixelated phosphors 941, 942, and 943 are respectively collected by optical subsystems 951, 952, and 953 (similar to those shown in FIG. 8). The superposition of the three color light beams is accomplished by right angle static mirrors 961 and 963 and cube color combiner 960. The color images or video are then directed to the screen 995 or directly to the observer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A structured phosphor device comprising:
a phosphor configured for laser excitation, the phosphor comprising an array of pixel regions separated by boundary regions, wherein one or more pixel regions of the array of pixel regions are designed to be addressed by a laser light beam incident through a first surface of the phosphor into phosphor material thereof and generate at least a partially emitted light beam from the phosphor, wherein the boundary regions are configured to limit the cross-talk of the laser light beam and the emitted light beam between the one or more addressed pixel regions and adjacent pixel regions;

a surface layer with modification associated with the first surface of the phosphor; and a substrate attached to a second surface of the phosphor.

2. The structured phosphor device of claim 1, wherein the emitted light beam from the phosphor with or without a portion of the laser light beam creates a substantially white light.

3. The structured phosphor device of claim 1, wherein the pixel region comprises a size of less than 1 mm×1 mm.

4. The structured phosphor device of claim 1, wherein the pixel region comprises a size of less than 500 µm×500 µm.

5. The structured phosphor device of claim 1, wherein the pixel region comprises a size of less than 250 µm×250 µm.

6. The structured phosphor device of claim 1, wherein the pixel region comprises a size of less than 100 µm×100 µm.

7. The structured phosphor device of claim 1, wherein the laser light beam is from a gallium and nitrogen containing laser diode emitting a blue wavelength or a violet wavelength.

8. The structured phosphor device of claim 1, wherein the laser light beam is modulated and guided by scanning mirror(s) to the first surface of the phosphor for individually addressing each of the array of pixel regions in a time period of a scan cycle.

9. The structured phosphor device of claim 1, wherein the laser light beam is modulated and guided by scanning mirror(s) to the first surface of the phosphor for collectively addressing multiple of the array of pixel regions in a same time period of a scan cycle.

10. The structured phosphor device of claim 1, wherein the surface layer with modification associated with the first surface of the phosphor comprises an anti-reflective coating or a surface roughening feature or a combination of both overlying the first surface.

11. The structured phosphor device of claim 2, further comprising an optically reflecting film between the second surface of the phosphor and the substrate to guide the substantially white light out of the first surface of the phosphor operated in a reflective mode.

12. The structured phosphor device of claim 11, wherein the substrate comprises a material characterized as thermally conductive and optically reflective to broadband wavelengths of the substantially white light.

13. The structured phosphor device of claim 2, further comprising an anti-reflective film formed between the second surface of the phosphor and the substrate to guide the substantial white light out of the second surface of the phosphor operated in a transmissive mode.

14. The structured phosphor device of claim 13, wherein the substrate comprises a material characterized as thermally conductive and optically transparent to the substantially white light.

15. The structured phosphor device of claim 1, wherein the phosphor comprises one phosphor selected from YAG, LuAG, red nitrides, aluminates, oxynitrides, $CaMgSi_2O_6$:$Eu^{2+}$, BAM:$Eu^{2+}$, AlN:$Eu^{2+}$, $(Sr,Ca)_3MgSi_2O_8$:$Eu^{2+}$, and JEM.

16. The structured phosphor device of claim 1, wherein the boundary regions comprise a metalized conductive material being optically reflective to wavelengths of combined spectra of the incident light and the emitted light.

17. A structured phosphor device comprising:
a frame member comprising wall regions separating multiple opening of window regions;
a phosphor material filled in each of the multiple openings with a first surface thereof being exposed to an excitation light from one or more laser sources to generate an emitted light out of each window region;
a surface layer with modification associated with the first surface of the phosphor material; and
a substrate attached to a second surface of the phosphor material in each of the multiple openings.

18. The structured phosphor device of claim 17, wherein the phosphor material comprises a bulk solid sintered from powders filled in each window region, the powers being selected from one of YAG, LuAG, red nitrides, aluminates, oxynitrides, $CaMgSi_2O_6$:$Eu^{2+}$, BAM:$Eu^{2+}$, AlN:$Eu^{2+}$, $(Sr,Ca)_3MgSi_2O_8$:$Eu^{2+}$, and JEM.

19. The structured phosphor device of claim 18, wherein the powders comprise particles with sizes ranging from a few nano-meters to a few micrometers.

20. The structured phosphor device of claim 17, wherein the wall regions of the frame member comprise a minimum volume compared with that of the phosphor material filled in the multiple openings.

21. The structured phosphor device of claim 20, wherein the wall regions comprise a metalized film coated from an edge of the wall regions joined with the first surface to another edge of the wall regions joined with the second surface.

22. The structured phosphor device of claim 17, wherein the multiple openings of the frame member comprise a uniform size and shape, wherein the phosphor material filled in the multiple openings forms an array of phosphor pixels with each pixel size having the uniform size.

23. The structured phosphor device of claim 22, wherein the pixel size comprises a lateral dimension ranging from a few millimeters to less than 100 µm and a depth ranging from 100 µm to 200 µm or greater, and the array of phosphor pixels comprises total number of pixels ranging from 100×100 pixels or less to 1024×1920 pixels.

24. The structured phosphor device of claim 22, wherein each of the array of phosphor pixels comprises a rectangle including a square base shape with substantially vertical sides or a reversed pyramid shape with slopping sides.

25. The structured phosphor device of claim 17, wherein the surface layer comprises an anti-reflective film or a roughened surface structure or a combination of both.

26. The structured phosphor device of claim 25, wherein the anti-reflective film comprises a material that is configured to substantially minimize reflection of less than 1% to the excitation light and to less than 10% of the emitted light thereby.

27. The structured phosphor device of claim 17, further comprises an optically reflective layer formed between the second surface of the phosphor material and the substrate.

28. The structured phosphor device of claim 27, wherein the optically reflective layer comprises optical characteristics of substantially reflecting both the excitation light and the emitted light to allow the emitted light outputted from the first surface of the phosphor material.

29. The structured phosphor device of claim 28, wherein the substrate that is attached with the second surface of the phosphor material via the optically reflective layer comprises a thermal conductive material.

30. The structured phosphor device of claim 17, further comprises an optically transmissive layer to at least the emitted light for bonding the second surface of the phosphor material and the substrate.

31. The structured phosphor device of claim 30, wherein the substrate comprises a thermally conductive material that is at least transparent to the emitted light to allow the emitted light outputted from the second surface of the phosphor material and through the transmissive layer and the substrate.

32. A pixelated phosphor device comprising:
   a plate of phosphor material configured to an array of pixels being mutually separated by a thin wall;
   a first optical layer overlying a first surface of the plate of phosphor material which is subjected to an excitation light beam for inducing an emitted light beam out of each of the array of pixels;
   a second optical layer overlying a second surface of the plate of phosphor material, the second surface being opposed to the first surface; and
   a substrate attached to the second optical layer.

33. The pixelated phosphor device of claim 32, wherein the plate of phosphor material comprises a single-crystalline phosphor or poly-crystalline phosphor.

34. The pixelated phosphor device of claim 32, wherein the array of pixels comprises a uniform pixel size and pixel shape.

35. The pixelated phosphor device of claim 34, wherein the pixel size comprises lateral dimension ranging from a few millimeters to less than 100 μm and a depth ranging from 100 μm to 200 μm or greater, and the array of phosphor pixels comprises total number of pixels ranging from 100× 100 pixels or less to 1024×1920 pixels.

36. The pixelated phosphor device of claim 32, wherein the thin wall comprises metalized material with optical reflection characteristics for both the excitation light beam and the emitted light beam.

37. The pixelated phosphor device of claim 32, wherein the first optical layer comprises an anti-reflective film characterized for substantially enhancing >99% of the excitation light beam being passed into each of the array of pixels.

38. The pixelated phosphor device of claim 32, wherein the second optical layer comprises a reflective characteristic for substantially reflecting both the excitation light beam and the emitted light beam at the second surface to guide the emitted light out of the first surface of the phosphor material operated in reflective mode.

39. The pixelated phosphor device of claim 32, wherein the second optical layer comprises a transmissive characteristic for passing the emitted light beam out of the second surface of the phosphor material operated in transmissive mode.

40. The pixelated phosphor device of claim 39, wherein the substrate comprises a material being optically transparent at least for the emitted light beam and thermally conductive for dissipating heat of the phosphor material.

* * * * *